United States Patent
Bernacchia et al.

(10) Patent No.: US 9,397,645 B2
(45) Date of Patent: Jul. 19, 2016

(54) CIRCUIT FOR COMMON MODE REMOVAL FOR DC-COUPLED FRONT-END CIRCUITS

(71) Applicant: Infineon Technologies Austria AG, Villach (AT)

(72) Inventors: Giuseppe Bernacchia, Villach (AT); Cha-fu Tsai, Torrance, CA (US)

(73) Assignee: Infineon Technologies Austria AG, Villach (AT)

( * ) Notice: Subject to any disclaimer, the term of this patent is extended or adjusted under 35 U.S.C. 154(b) by 135 days.

(21) Appl. No.: 14/225,003

(22) Filed: Mar. 25, 2014

(65) Prior Publication Data

US 2015/0280696 A1    Oct. 1, 2015

(51) Int. Cl.
*H03L 5/00* (2006.01)
*H03K 5/007* (2006.01)

(52) U.S. Cl.
CPC ...................... *H03K 5/007* (2013.01)

(58) Field of Classification Search
CPC ............................. H03K 5/003; H03K 5/007
USPC ....................................................... 327/307
See application file for complete search history.

(56) References Cited

U.S. PATENT DOCUMENTS

| | | | |
|---|---|---|---|
| 7,532,072 B1 * | 5/2009 | Tavakoli Dastjerdi et al. | 330/258 |
| 7,724,043 B1 * | 5/2010 | LeBoeuf et al. | 327/91 |
| 8,299,837 B1 * | 10/2012 | Lin | 327/337 |
| 2002/0011900 A1 * | 1/2002 | Baschirotto et al. | 330/258 |
| 2003/0001674 A1 * | 1/2003 | Nagaraj | 330/258 |
| 2007/0115030 A1 * | 5/2007 | Bhattacharya et al. | 326/83 |
| 2012/0154048 A1 * | 6/2012 | Myles | 330/260 |

* cited by examiner

*Primary Examiner* — William Hernandez
(74) *Attorney, Agent, or Firm* — Shumaker & Sieffert, P.A.

(57) ABSTRACT

In one example, a method includes receiving a first differential signal including a first voltage signal and a second voltage signal, wherein the first differential signal includes a first common mode voltage; receiving a second common mode voltage. The method further includes determining, by a circuit, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage. The method further includes outputting, substantially continuously, the second differential signal.

22 Claims, 15 Drawing Sheets

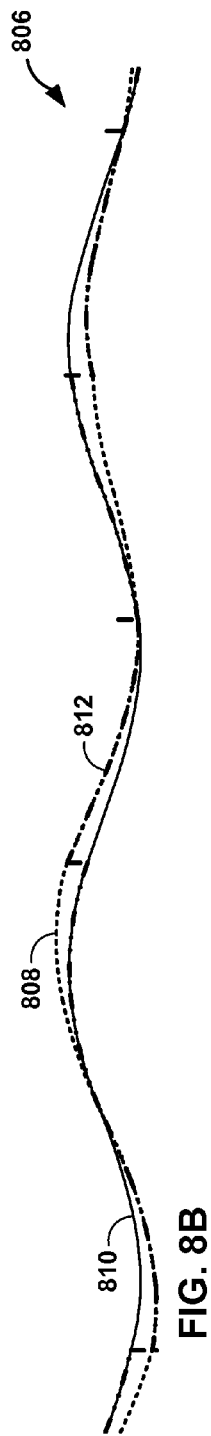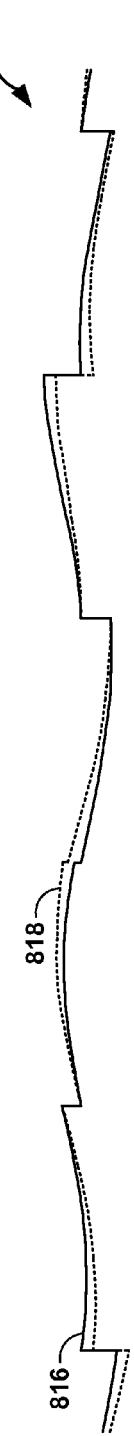

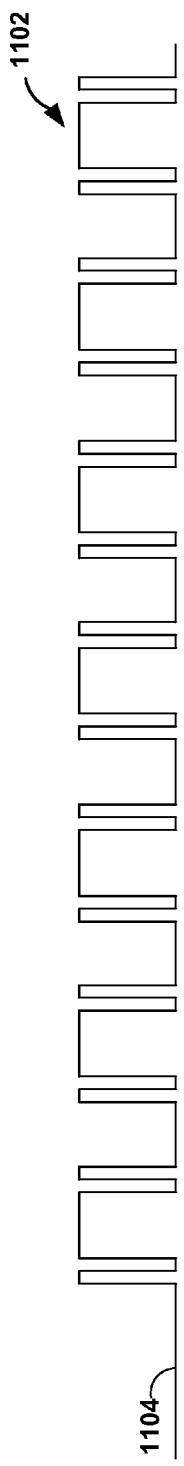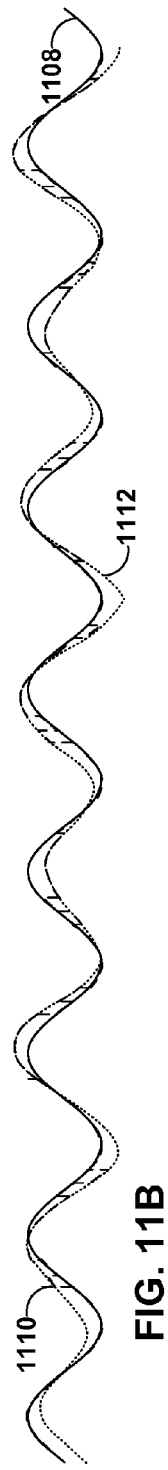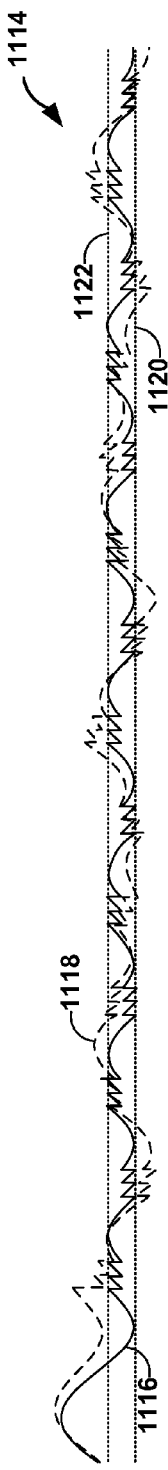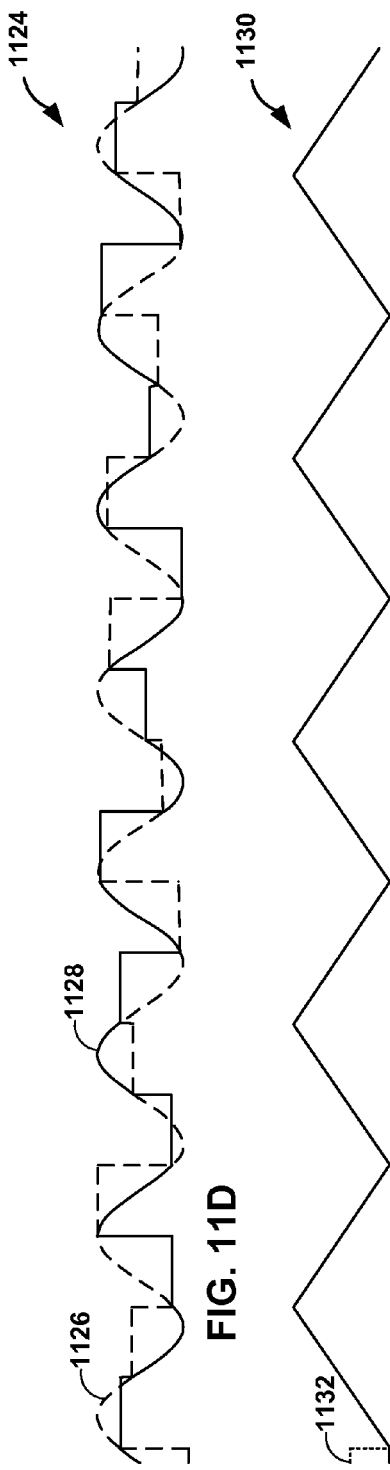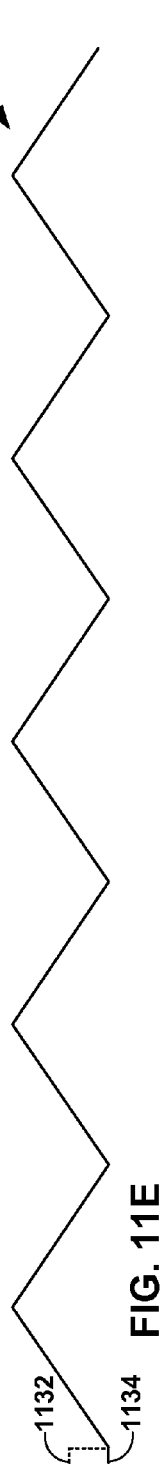

CIRCUIT FOR COMMON MODE REMOVAL FOR DC-COUPLED FRONT-END CIRCUITS

TECHNICAL FIELD

This disclosure relates to circuits and, more particularly, to circuits for removing a common mode voltage from DC-coupled front-end circuits.

BACKGROUND

A front-end circuit generically refers to a circuit or circuitry that provides an input to a back-end circuit. The front-end circuit typically supplies to the back-end circuit either a single-ended signal or a differential signal. A single-ended signal is referenced to a common voltage, and thus, the information contained in the single-ended signal is represented as the difference between the single-ended signal and the common mode voltage. A differential signal includes two inputs, each referenced to a common voltage. Therefore, the information carried by the differential signal is represented as the difference between the voltages of the two inputs.

SUMMARY

In one example, a method includes receiving a first differential signal including a first voltage signal and a second voltage signal, wherein the first differential signal includes a first common mode voltage; receiving a second common mode voltage; determining, by a circuit, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage; and outputting, substantially continuously, the second differential signal.

In another example, a system includes a first input pin configured to receive a first voltage signal of a first differential voltage signal; a second input pin configured to receive a second voltage signal of the first differential voltage signal, wherein the first differential voltage signal includes a first common mode voltage; a second input pin configured to receive a second common mode voltage; a circuit comprising a plurality of capacitors and a plurality of switches, wherein the circuit is configured to determine a second differential voltage signal based on the first differential voltage signal, wherein the second differential voltage signal includes the second common mode voltage; a first output pin; and a second output pin, wherein the circuit is configured to substantially continuously output the first voltage signal of the second differential voltage signal at the first output pin, and wherein the circuit is configured to substantially continuously output the second voltage signal of the second differential signal at the second output pin.

In yet another example, an apparatus includes means for receiving a first differential signal including a first voltage signal and a second voltage signal, wherein the first differential signal includes a first common mode voltage; means for receiving a second common mode voltage; means for determining, by a circuit, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage; and means for outputting, substantially continuously, the second differential signal.

The details of one or more examples are set forth in the accompanying drawings and the description below. Other features, objects, and advantages will be apparent from the description and drawings, and from the claims.

BRIEF DESCRIPTION OF DRAWINGS

FIGS. 8A-8E are graphs illustrating various signals of an example circuit for controlling the common mode of a differential signal, in accordance with one or more techniques of this disclosure.

FIGS. 11A-11E are graphs illustrating various signals of an example circuit for controlling the common mode of a differential signal, in accordance with one or more techniques of this disclosure.

DETAILED DESCRIPTION

The components of a differential signal may include a common mode voltage. The common mode voltage may be defined as the signal that the separate components of a differential signal have in common. The common mode may be entirely DC, entirely AC, or include both AC and DC components. In some examples, the common mode of a differential signal may be variable over time. In some examples, it may be desirable for a circuit to maintain the output common mode as a constant even if the input common mode is varying.

In some examples, a sampled system may be used to obtain a differential signal with a consistent common mode. In a sampled system, the input signal may be sampled with respect to some desired common mode, and the front-end may be implemented as a switched capacitor circuit. Blocking capacitors may store the signal and at the same time decouple the front-end from the large DC swing.

However, as a result of this decoupling, the output differential signal may not be continuous with respect to time. In other words, the output signal may not be available during the decoupling. Another drawback of samples systems is that the frequency increase necessary to achieve a sufficiently high time resolution may result in high power consumption by the sampling elements. Another potential drawback of a sampled system is the presence of an input anti-aliasing circuit necessary to prevent frequency fold back and the requirements for high voltage switches to connect to the input.

In some examples, a rail-to-rail architecture may be used to obtain a differential signal with a constant common mode. In rail-to-rail architectures, the front-end includes complementary stages which can work over the full range of the input signal common mode voltage. However, rail-to-rail systems may be restricted to relatively low voltages. Another potential drawback is the difference in performance (gain and offset) of the complementary inputs, which may need dedicated trimming.

Figure 1:
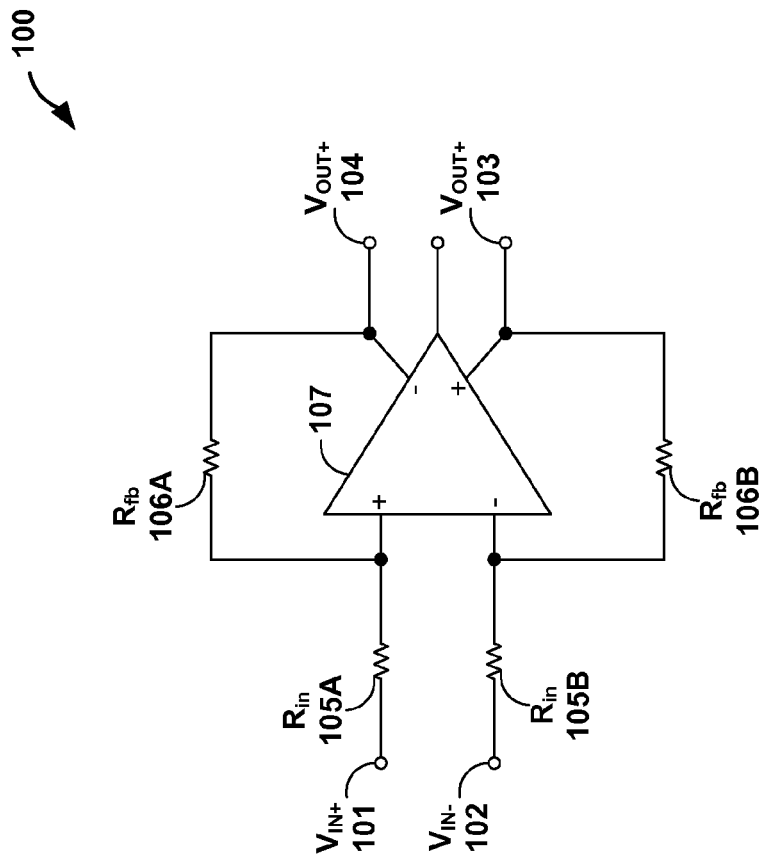
FIG. 1 is a circuit diagram illustrating an example resistor-coupled amplifier circuit, in accordance with one or more techniques of this disclosure.

In some examples, a resistor-coupled amplifier circuit may be used to obtain a differential signal with a constant common mode. FIG. 1 is a circuit diagram illustrating an example resistor-coupled amplifier circuit 100, in accordance with one or more techniques of this disclosure. Resistor-coupled amplifier circuit 100 includes differential inputs 101 and 102, differential outputs 103 and 104, amplifier 107, input resistors 105A and 105B, and feedback resistors 106A and 106B. Amplifier 107 receives a differential input signal ($V_{IN+}-V_{IN-}$) corresponding to the difference between input 101 and input 102 and produces a differential output signal ($V_{O-}-V_{O+}$) corresponding to the difference between output 103 and output 104. In a theoretically perfect system, the differential output signal would be an exact replica of the differential input signal with a gain factor, meaning ($V_{IN+}-V_{IN-}$) would equal $k*(V_{O-}-V_{O+})$, where k represents the gain factor of amplifier circuit 100, which can be varied based on the values of resistors 105A/105B and 106A/106B. In real world systems, however, the differential output signal may not be an exact replica of the differential input signal because of the presence of the common mode voltage.

The common mode voltage of the input may be expressed by $(V_{IN+}+V_{IN-})/2$, and the common mode voltage of the output may be expressed by $(V_{O-}-V_{O+})/2$. Thus, the input common mode and the output common mode are different.

In some examples, resistor-coupled amplifier circuit 100 may provide the advantage of a single amplifier for which the input common mode may be set arbitrarily. However, using resistor-coupled amplifier circuit 100 as a front end circuit may entail one or more disadvantages. As one example, a disadvantage of resistor-coupled amplifiers is the finite impedance at the input, which may not acceptable for some applications.

Figure 2:
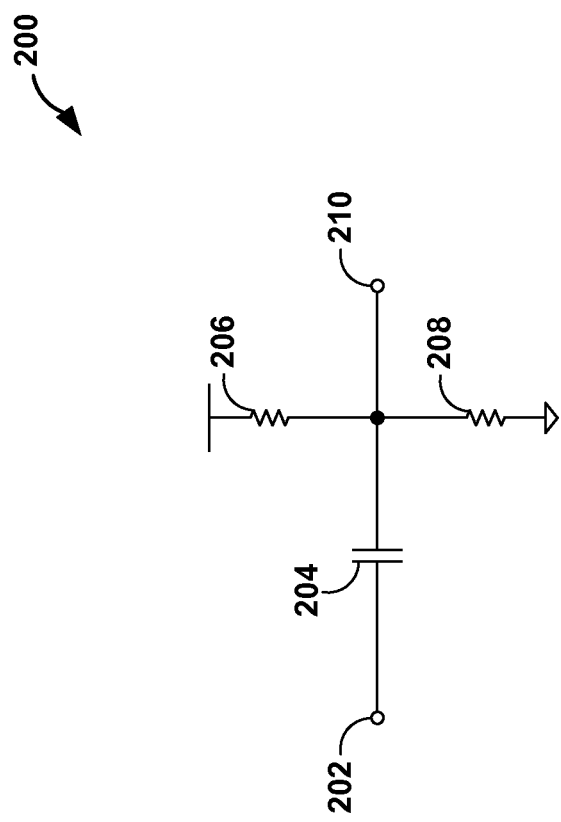
FIG. 2 is a circuit diagram illustrating an example biasing circuit for an AC-coupled amplifier, in accordance with one or more techniques of this disclosure.

In some examples, a biasing circuit may be used to obtain a differential signal with a constant common mode. FIG. 2 is a circuit diagram illustrating an example biasing circuit 200 for an AC-coupled amplifier, in accordance with one or more techniques of this disclosure. Circuit 200 includes input 202, capacitor 204, resistor 206, resistor 208, and output 210. Input 202 may receive an input signal, and capacitor 204 may block any DC component of the input signal from being transmitted to output 210. The ratio of resistor 206 and resistor 208 may be used to set the DC component of the signal provided at output 210. In some examples, a first biasing circuit 200 may be positioned at a first differential input of a front end system and a second biasing circuit 200 may be positioned at a second differential input of the front end system.

The use of biasing circuit 200 may at the differential inputs of a front end system entail one or more disadvantages. As one example, biasing circuit 200 may reject not only the common mode of the differential input signal but also rejects the DC component of the input signal.

This disclosure describes techniques for removing variance in a common mode voltage from DC-coupled front-end circuits. As will be explained in greater detail below, the variance of the common mode voltage may be removed by shifting the output common mode voltage to a known, fixed voltage. The techniques of this disclosure may be used to design circuits that can shift a variable, or moving, common mode voltage to a fixed level such that the common mode voltage of an output of a circuit may be independent from the common mode voltage of the input of the circuit, thus enabling a differential output to more closely match, possibly with some sort of gain factor, a differential input. This disclosure further describes techniques for interfacing a front end circuit, such as an amplifier or analog-to-digital converter (ADC), to a differential input signal characterized by a very large common mode while keeping a DC coupling. These techniques may, for example, be implemented in current sense circuits for switching regulators or motor drives, where the sense element common mode voltage swing can be very large, but the main interest is having a correct measurement of the DC current flowing into the load.

The techniques of this disclosure may, for example, enable a circuit to provide continuous time readout by not sampling an input signal and directly transferring the input signal to the front-end. Additionally, the techniques of this disclosure may result in a circuit where the input of the front-end is subject to a reduced swing because the input common mode is sampled and subtracted from the input signal. Moreover, the swing may be controlled by adjusting the sampling frequency at which the circuit samples the common mode voltage. The techniques of this disclosure may allow for the use of simpler amplifier structures compared to rail-to-rail systems.

Figure 3:
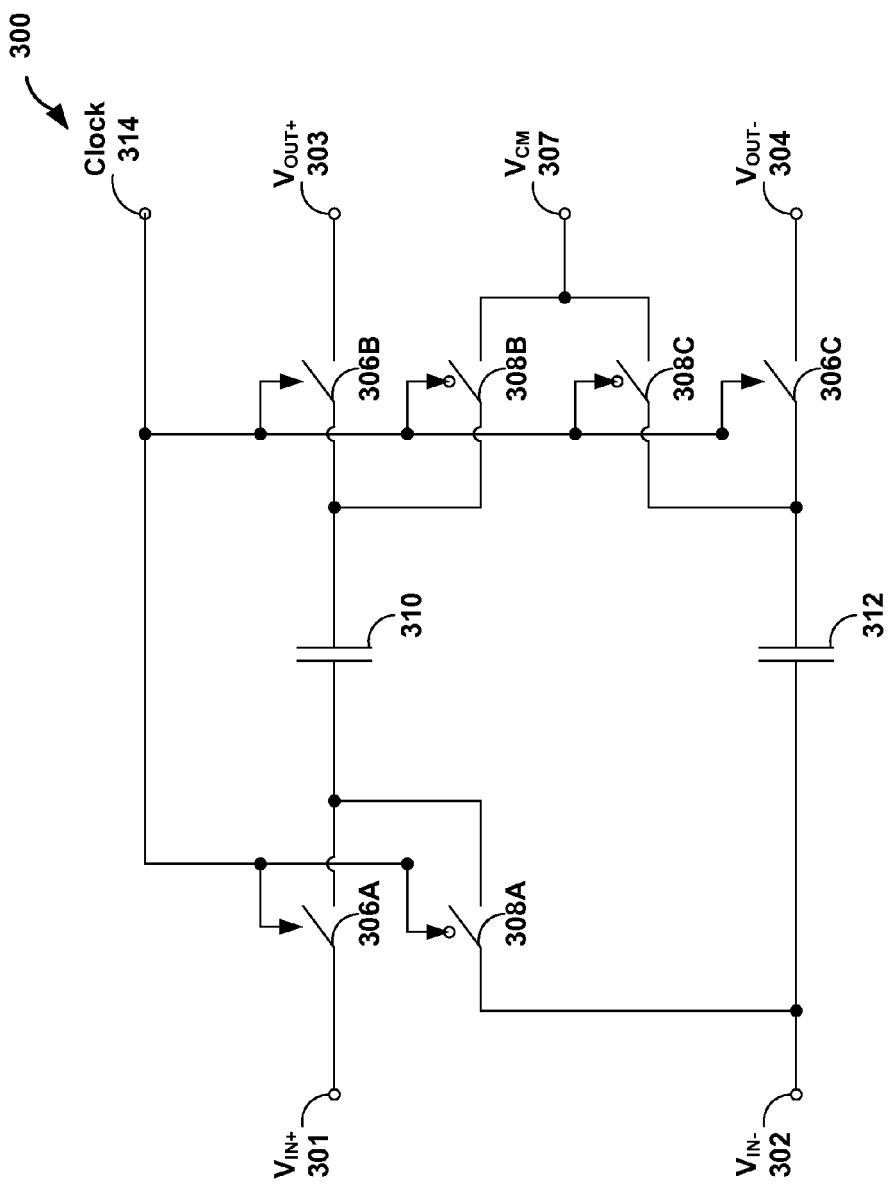
FIG. 3 is a circuit diagram illustrating an example circuit for controlling the common mode of a differential signal, in accordance with one or more techniques of this disclosure.

FIG. 3 is a circuit diagram illustrating example circuit 300 for controlling the common mode of a differential signal, in accordance with one or more techniques of this disclosure. Circuit 300 may, for example, be part of a front-end system which is DC-coupled to an input signal and may perform a differential sensing of the input signal. Circuit 300 includes input 301 ($V_{IN+}$), input 302 ($V_{IN-}$), output 303 ($V_{OUT+}$), output 304 ($V_{OUT-}$), common mode input 307 ($V_{CM}$), capacitor 310, capacitor 312, switches 306A-306C (collectively "switches 306"), switches 308A-308C (collectively "switches 308"), and clock 314. Circuit 300 receives a differential input signal ($V_{IN+}$-$V_{IN-}$) corresponding to the difference between input 301 and input 302 and produces a differential output signal ($V_{OUT-}$-$V_{OUT+}$) corresponding to the difference between output 303 and output 304. The differential input signal may include an input common mode signal. Circuit 300 may be configured to remove the common mode input signal from the differential input signal ($V_{IN+}$-$V_{IN-}$) and output the differential output signal ($V_{OUT-}$-$V_{OUT+}$) such that it includes the common mode received at common mode input 307. Additionally, the differential output signal ($V_{OUT-}$-$V_{OUT+}$) may be output such that it closely matches the differential input signal ($V_{IN+}$-$V_{IN-}$).

Clock 314 controls switches 306 and 308. Switches 306 and 308 are out of phase, such that switches 306 are closed when switches 308 are open, and switches 306 are open when switches 308 are closed. In this way, switches 306 and 308 may be used to create $V_{CM}$ paths and output paths. When switches 306 are closed and switches 308 are open, then capacitors 310 and 312 couple the differential input signal ($V_{IN+}$-$V_{IN-}$) to a differential output signal ($V_{OUT-}$ $V_{OUT+}$) via output paths.

During a first phase of operation, switches 306 are open, and switches 308 are closed. During the first phase, input 301 is connected to a first terminal of capacitor 310 via switch 306A, and a second terminal of capacitor 310 is connected to output 303 via switch 306B. Also during the first phase, a second terminal of capacitor 312 is connected to output 304 via switch 306C. Throughout both phases of operation, a first terminal of capacitor 312 is connected to input 302. In this case, input voltage $V_{IN-}$ at input 302 may be considered as a reference for what concerns the input common mode voltage.

At the end of phase 1, the charge stored in each of capacitors 310 and 312 may be represented by equations (1) and (2) below, where $Q_{310}$ is the charge at capacitor 310, $Q_{312}$ is the charge at capacitor 312, $V_{CM}$ is the voltage at common mode input 307, and $V_{IN-1}$ is the voltage at input 302 at the end of phase 1.

$$Q_{310}=C_{310}*(V_{IN-1}-V_{CM}) \quad (1)$$

$$Q_{312}=C_{312}*(V_{IN-1}-V_{CM}) \quad (2)$$

During a second phase, switches 306 are open, and switches 308 are closed. During the second phase, input 302 is connected to the first terminal of capacitor 310 via switch 308A. Also during the second phase, the second terminal of capacitor 310 and the second terminal of capacitor 312 are connected to common mode input 307 via switches 308B and 308C, respectively. During the second phase, the voltages at outputs 303 and 304 are as follows:

$$V_{OUT+}=V_{IN+}(V_{IN-1}=V_{CM}) \quad (3)$$

$$V_{OUT-}=V_{IN-}(V_{IN-1}=V_{CM}) \quad (4)$$

The differential output voltage between outputs 303 and 304 may be represented by equation (5) below, such that the differential nature of the input signal may be preserved.

$$V_{OUT+}-V_{OUT-}=V_{IN+}-V_{IN-} \quad (5)$$

The common mode voltage of the output signal may be represented by equation (6), below.

$$(V_{OUT+}+V_{OUT-})/2=V_{CM}+(V_{IN+}+V_{IN-})/2-V_{IN-1} \quad (6)$$

The output common mode signal may be centered around $V_{CM}$ and varies by the amount $(V_{IN+}+V_{IN-})/2-V_{IN-1}$. In some examples, the clock frequency of clock 315 may be selected in order to minimize this variation during the second phase. In some examples, the clock frequency of clock 315 may be selected based on the input signal dynamic.

Circuit 300 represents an alternative implementation to circuit 300 of the techniques of this disclosure. In operation, circuit 300 provides a continuous output because while one set of capacitors are storing the difference between $V_{IN-}$ and $V_{CM}$, another set of capacitors are adding previously stored values to the output. Circuit 500, in contrast, only utilizes one set of capacitors, and thus while capacitors 510 and 512 are storing the difference between $V_{IN-}$ and $V_{CM}$, inputs 501 and 502 are not connected to outputs 503 and 504.

Figure 4:
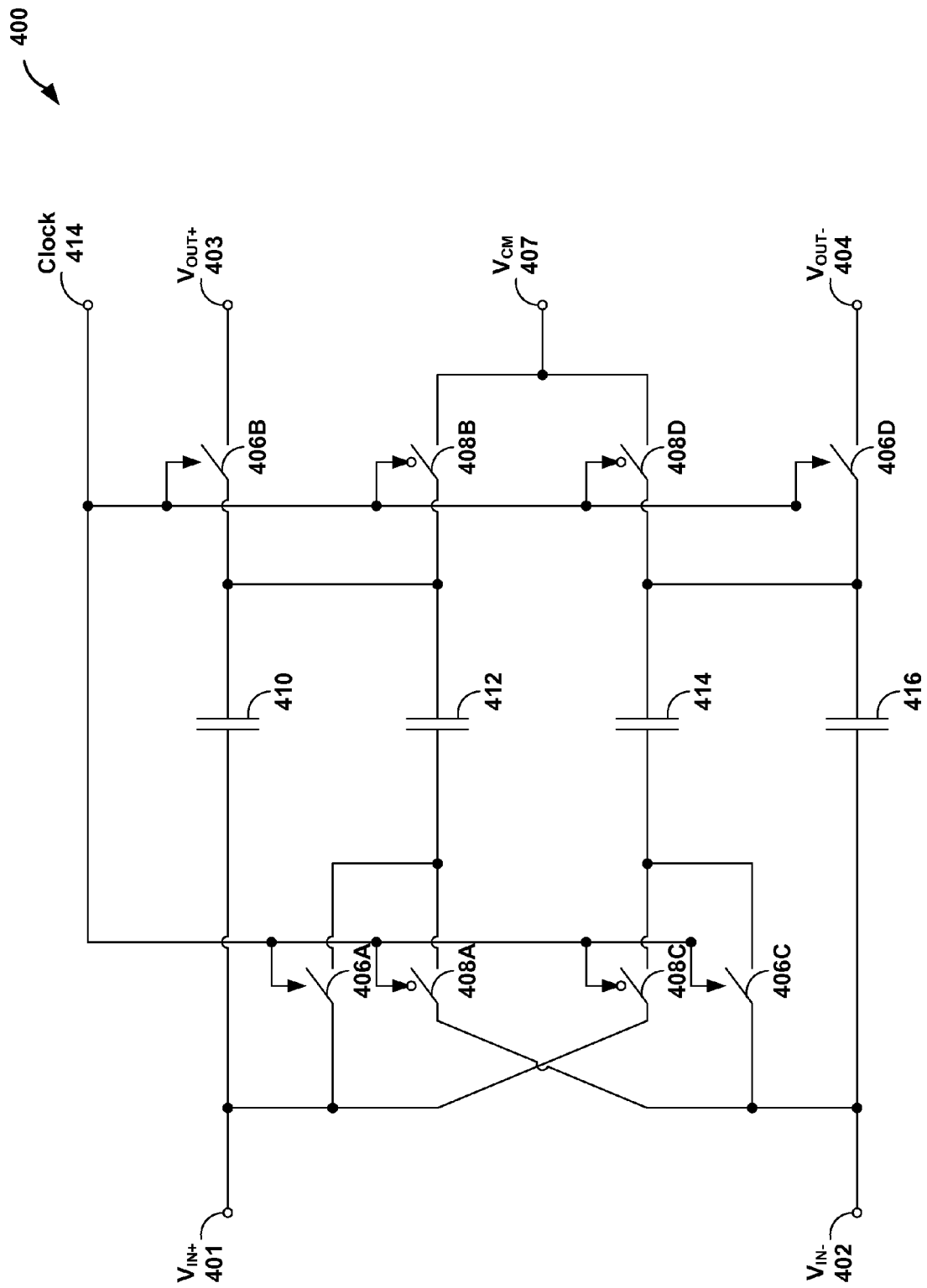
FIG. 4 is a circuit diagram illustrating another example circuit for controlling the common mode of a differential signal, in accordance with one or more techniques of this disclosure.

FIG. 4 is a circuit diagram illustrating an example circuit 400 that may output a differential signal with a selected common mode, in accordance with one or more techniques of this disclosure. As illustrated in FIG. 4, circuit 400 includes input 401 ($V_{IN+}$), input 402 ($V_{IN-}$), output 403 ($V_{OUT+}$), output 404 ($V_{OUT-}$), switches 406A-406D (collectively "switches 406"), common mode input 407 ($V_{CM}$), switches 408A-408D (collectively "switches 408"), capacitor 410, capacitor 412, capacitor 414, capacitor 416, and clock 414.

Circuit 400 may perform similar operations to circuit 300 of FIG. 3. For instance, circuit 400 receive a differential input signal ($V_{IN+}$-$V_{IN-}$) corresponding to the difference between input 401 and input 402 and produce a differential output signal ($V_{OUT-}$-$V_{OUT+}$) corresponding to the difference between output 403 and output 404. The differential input signal may include an input common mode signal. Circuit 400 may be configured to remove the common mode input signal from the differential input signal ($V_{IN+}$-$V_{IN-}$) and output the differential output signal ($V_{OUT-}$-$V_{OUT+}$) such that it includes the common mode received at common mode input 407. Additionally, the differential output signal ($V_{OUT-}$-$V_{OUT+}$) may be output such that it closely matches the differential input signal ($V_{IN+}$-$V_{IN-}$).

However, in this case circuit 400 may remove the real input common mode and may not use one of the two differential input pins as a reference. Additionally, circuit 400 may include two capacitors for each of the input pins. Specifically, capacitor 410 and capacitor 412 may couple input 401 to output 401 and capacitor 414 and capacitor 416 may couple input 402 to output 404. The second terminals of capacitor 410 and capacitor 412 are shorted together, and the second terminals of capacitor 414 and capacitor 416 are shorted together.

In response to a signal received at clock 414, switches 406A and 408A connect alternatively the first terminal of capacitor 412 first to $V_{IN+}$ 401 and then to $V_{IN-}$ 402. Also in response to a signal received at clock 414, switches 406C and 408C connect alternatively the first terminal of capacitor 414 first to $V_{IN-}$ 402 and then to $V_{IN+}$ 401. Also in response to a signal received at clock 414, switches 406B and 408B, and switches 406D and 408D connect alternatively the second terminal of all capacitors first to a fixed common mode voltage $V_{CM}$ and then to the corresponding output pin. In other words, the clock signal received at clock 414 defines the state of the switches. During phase 1, the clock signal is at low level. At the end of phase 1, the charges stored in the capacitors may be represented by equations (7)(10) below, where vp0 and vn0 are the voltages at the inputs $V_{IN+}$ 401 and $V_{IN-}$ 401 at the end of phase 1.

$$Q_{410}=C_{410}*(vp0-V_{CM}) \quad (7)$$

$$Q_{412}=C_{412}*(vn0-V_{CM}) \quad (8)$$

$$Q_{414} = C_{414} * (vp0 - V_{CM}) \quad (9)$$

$$Q_{416} = C_{416} * (vn0 - V_{CM}) \quad (10)$$

During phase 2 the clock is at high level. Capacitors 410 and 412 are connected in parallel between input $V_{IN+}$ 401 and output $V_{OUT+}$ 403, while capacitors 414 and 416 are connected in parallel between input $V_{IN-}$ 402 and output $V_{OUT-}$ 404. The parallel connection causes charge redistribution between the two capacitors in each leg, so that the voltages across the equivalent capacitors may be represented by equations (11) and (12) below, where $v_{1,2}$ represents the voltage across parallel capacitors 410 and 412, and where $v_{3,4}$ represents the voltage across parallel capacitors 414 and 416.

$$v_{410,412} = \frac{C_{410}(vp0 - vcm) + C_{412}(vn0 - vcm)}{C_{410} + C_{412}} \quad (11)$$

$$v_{414,416} = \frac{C_{414}(vp0 - vcm) + C_{416}(vn0 - vcm)}{C_{414} + C_{416}} \quad (12)$$

If there is no load at $V_{OUT+}$ 403 and $V_{OUT-}$ 404 to discharge the capacitors, the capacitors may act as floating batteries such that the output voltages may be represented by equations (13) and (14) below.

$$V_{OUT+} = V_{IN+} - V_{410,412} \quad (13)$$

$$V_{OUT-} = V_{IN-} - V_{414,416} \quad (14)$$

The differential output voltage may be represented by equation (15) below.

$$vop - von = (vp - vn) - \frac{C_{410}vp0 + C_{412}vn0}{C_{410} + C_{412}} + \frac{C_{414}vp0 + C_{416}vn0}{C_{414} + C_{416}} \quad (15)$$

In some examples, the capacitance of capacitor 410 may be the same as the capacitance of capacitor 414, and the capacitance of capacitor 412 may be the same as the capacitance of capacitor 416. In such examples, many of the terms equation (15) cancel out such that the differential output voltage may be represented by equation (16) below.

$$V_{OUT+} - V_{OUT-} = V_{IN+} - V_{IN-} \quad (16)$$

In some examples, an error term may appear due to the capacitor mismatch. For instance, an error term may appear in accordance with equation (17) below.

$$V_{OUT+} - V_{OUT-} = V_{IN+} - V_{IN-} + err \quad (17)$$

In some examples, the value of the error term may represented by equation (18) below.

$$err = vp0 \times \left[ \frac{C_3}{C_3 + C_4} - \frac{C_1}{C_1 + C_2} \right] + vn0 \times \left[ \frac{C_4}{C_3 + C_4} - \frac{C_2}{C_1 + C_2} \right] \quad (18)$$

In some examples, the output common mode may be represented by equation (19) below.

$$\frac{vop + von}{2} = vcm + \frac{vp + vn}{2} - \frac{vp0}{2}\left[\frac{C_3}{C_3+C_4} + \frac{C_1}{C_1+C_2}\right] + \frac{vn0}{2}\left[\frac{C_4}{C_3+C_4} + \frac{C_2}{C_1+C_2}\right] \quad (19)$$

In some examples, such as where the capacitances of the capacitors are perfectly matched, the output common mode may be represented by equation (20) below:

$$\frac{vop + von}{2} = vcm + \frac{(vp - vp0) + (vn - vn0)}{2} \quad (20)$$

In some examples, the input common mode cancellation may not be perfect and there may be a residue which may be signal dependent. However, where the signal variation is much smaller than its common mode, this error may be negligible. As such, the error may be tolerated by whatever components receive the output of circuit 400 (e.g., a back-end circuit).

Figure 5:
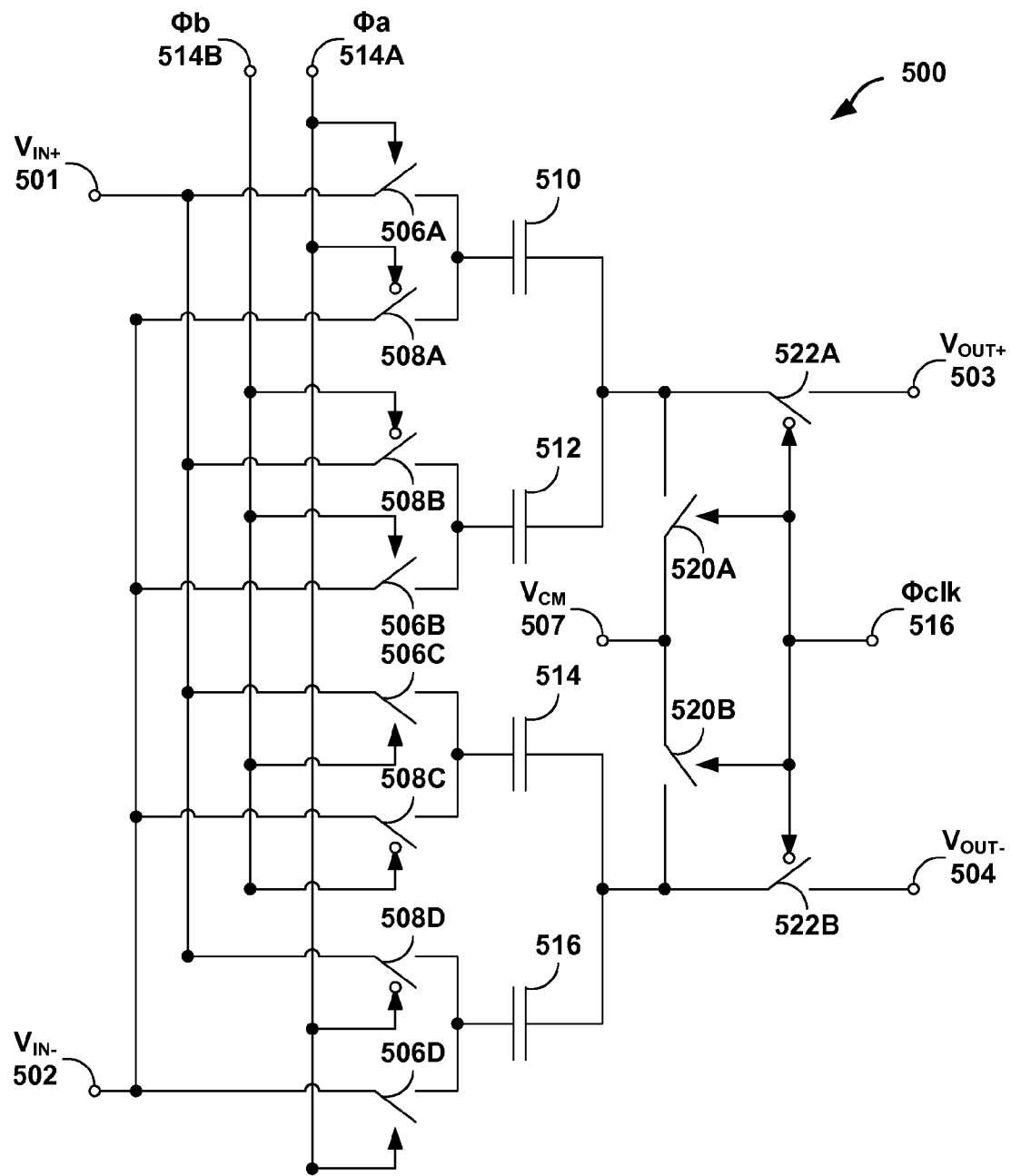
FIG. 5 is a circuit diagram illustrating another example circuit for controlling the common mode of a differential signal, in accordance with one or more techniques of this disclosure.

FIG. 5 is a circuit diagram illustrating an example circuit 500 that may output a differential signal with a selected common mode, in accordance with one or more techniques of this disclosure. As illustrated in FIG. 5, circuit 500 includes input 501 ($V_{IN+}$), input 502 ($V_{IN-}$), output 503 ($V_{OUT+}$), output 504 ($V_{OUT-}$), switches 506A-506D (collectively, "switches 506"), common mode input 507 ($V_{CM}$), switches 508A-508D (collectively, "switches 508"), switches 520A-520B (collectively, "switches 520"), switches 522A-522B (collectively, "switches 522"), capacitor 510, capacitor 512, capacitor 514, capacitor 516, Φa 514A, Φb 514B, and Φclk 516.

Circuit 500 may perform similar operations to circuit 300 of FIG. 3. For instance, circuit 500 receive a differential input signal ($V_{IN+} - V_{IN-}$) corresponding to the difference between input 501 and input 502 and produce a differential output signal ($V_{OUT-} - V_{OUT+}$) corresponding to the difference between output 503 and output 504. The differential input signal may include an input common mode signal. Circuit 500 may be configured to remove the common mode input signal from the differential input signal ($V_{IN+} - V_{IN-}$) and output the differential output signal ($V_{OUT-} - V_{OUT+}$) such that it includes the common mode received at common mode input 507. Additionally, the differential output signal ($V_{OUT-} - V_{OUT+}$) may be output such that it closely matches the differential input signal ($V_{IN+} - V_{IN-}$).

However, in this case, circuit 500 may output the differential signal as a truly differential signal. In other words, circuit 500 may output the differential output signal ($V_{OUT-} - V_{OUT+}$) without using one of the two differential input pins (e.g., $V_{IN+}$ 501 and $V_{IN-}$ 502) as a reference. As illustrated in FIG. 5, circuit 500 includes a single bank of capacitors per input (e.g., capacitors 510 and 512 as a first bank on $V_{IN+}$ 501, and capacitors 514 and 516 as a second bank on $V_{IN-}$ 502). However, in some examples, circuit 500 may include two or more banks of capacitors on each input.

In some examples, all of the capacitors in a single capacitor bank may have equal capacitance values. For instance, the capacitance of capacitor 510 may equal the capacitance of capacitor 512, and the capacitance of capacitor 514 may equal the capacitance of capacitor 516.

The operation of switches 506, switches 508, switches 520, and switches 522 may be dependent on Φa 514A, Φb 514B, and Φclk 516. For example, where the signal received at Φa 514A is at a high level switch 506A may connect a first terminal of capacitor 510 to $V_{IN+}$ 501, and switch 506D may connect a first terminal of capacitor 516 to $V_{IN-}$ 502. As another example, where the signal received at Φb 514B is at a high level switch 506B may connect a first terminal of capacitor 512 to $V_{IN-}$ 502, and switch 506C may connect a first terminal of capacitor 514 to $V_{IN+}$ 501. As another example, where Φclk 516 is at a high level, switches 520 may connect the second terminals of capacitor 510, capacitor 512, capacitor 514, and capacitor 516 to $V_{CM}$ 507. As a final example, where Φclk 516 is at a low level, switch 522A may connect the second terminals of capacitor 510, and capacitor 512 to $V_{OUT+}$ 503, and switch 522B may connect the second terminals of capacitor 514, and capacitor 516 to $V_{OUT-}$ 504.

During a first phase the signals at Φa 514A, Φb 514B, and Φclk 516 may all be at a high level. As a result, the first terminal of capacitor 510 and the first terminal of capacitor 514 are connected to $V_{IN+}$ 501, and the first terminal of capacitor 512 and the first terminal of capacitor 516 are connected to $V_{IN-}$ 502. Additionally, the second terminal of capacitor 510, the second terminal of capacitor 512, the second terminal of capacitor 514, and the second terminal of capacitor 516 are all connected to VCM 507. Therefore, during the first phase, the voltage across capacitor 510 and capacitor 514 is $V_{IN+}-V_{CM}$, and the voltage across capacitor 512 and capacitor 516 is $V_{IN-}-V_{CM}$.

During a second phase, the signal at Φa 514A may be at a high level while the signals at Φb 514B and Φclk 516 may be at a low level. As a result, the first terminal of capacitor 510, the first terminal of capacitor 512, the first terminal of capacitor 514, and the first terminal of capacitor 516 are all connected to $V_{IN+}$ 501. Additionally, the second terminal of capacitor 510, and the second terminal of capacitor 512 are connected to $V_{OUT+}$ 503, and the second terminal of capacitor 514, and the second terminal of capacitor 515 are connected to $V_{OUT-}$ 504. As capacitor 510 and capacitor 512 have equal capacitance, their accumulated charges are redistributed such that the voltage across capacitor 510 and capacitor 512 is represented by equation (21) below. Also, as capacitor 514 and capacitor 516 have equal capacitance, their accumulated charges are redistributed such that the voltage across capacitor 514 and capacitor 516 is represented by equation (22) below.

$$V_{510,512} = \frac{(V_{IN+}-V_{CM})+(V_{IN-}-V_{CM})}{2} = \frac{(V_{IN+}+V_{IN-})}{2} - V_{CM} \quad (21)$$

$$V_{514,516} = \frac{(V_{IN-}-V_{CM})+(V_{IN+}-V_{CM})}{2} = \frac{(V_{IN+}+V_{IN-})}{2} - V_{CM} \quad (22)$$

During a third phase, the signals at Φa 514A and Φb 514B may be at a low level, and the signal at Φclk 516 may be at a high level. As a result, the first terminal of capacitor 510 and the first terminal of capacitor 514 may be connected to $V_{IN-}$ 502, and the first terminal of capacitor 512 and the first terminal of capacitor 516 are connected to $V_{IN+}$ 501. Additionally, the second terminal of capacitor 510, the second terminal of capacitor 512, the second terminal of capacitor 514, and the second terminal of capacitor 516 are all connected to VCM 507. Therefore, during the third phase, the voltage across capacitor 510 and capacitor 514 is $V_{IN-}-V_{CM}$, and the voltage across capacitor 512 and capacitor 516 is $V_{IN+}-V_{CM}$.

During operation, circuit 500 may cycle bath and forth through the phases. For example, circuit 500 may operate in the first phase, then operate in the second phase, then operate in the third phase, then again operate in the second phase, and finally return to the first phase. As described above, phase one and phase three are similar except that the role of capacitor 510 is exchanged with the role of capacitor 512, and the role of capacitor 514 is exchanged with the role of capacitor 516. In this way, circuit 500 may remove errors due to mismatch in capacitance of the capacitors within the capacitor banks.

In some examples, circuit 500 may attenuate the differential signal. In such examples, the attenuation factor may be given by the partition between the front-end input impedance and the sampling capacitors impedance. In some examples, the input impedance of a front-end circuit is the input capacitance of the input stage. Therefore, the attenuation (ρ) may be approximated in accordance with equation (23) Error! Reference source not found.below. In some examples, a circuit, such as circuit 500 may compensate for the attenuation by increasing the gain of the front-end.

$$\rho = C_{IN}/(C_{IN}+C_{FE}) \quad (23)$$

Figure 6A:
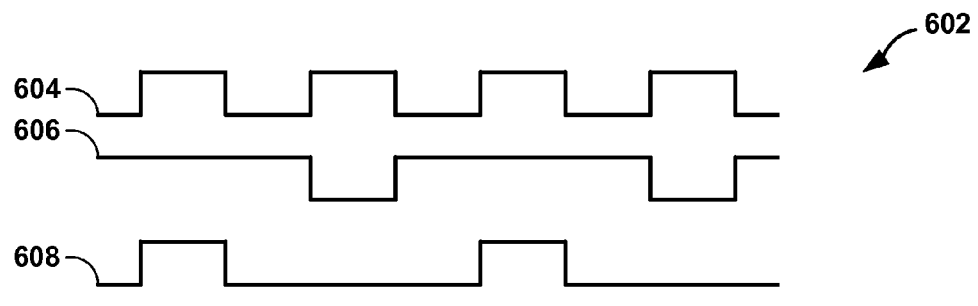
FIGS. 6A-6D are graphs illustrating various signals of an example circuit for controlling the common mode of a differential signal, in accordance with one or more techniques of this disclosure.

FIGS. 6A-6D are graphs illustrating various signals of an example circuit for controlling the common mode of a differential signal, in accordance with one or more techniques of this disclosure. As illustrated in FIG. 6A, graph 602 may include a horizontal axis representing time, first plot 604 illustrating a first digital signal, second plot 606 illustrating a second digital signal, and third plot 608 illustrating a third digital signal. In some examples, the first digital signal may represent the signal received at Φclk 516 of circuit 500 of FIG. 5. In some examples, the second digital signal may represent the signal received at Φa 514A of circuit 500 of FIG. 5. In some examples, the second digital signal may represent the signal received at Φb 514A of circuit 500 of FIG. 5.

Figure 6B:
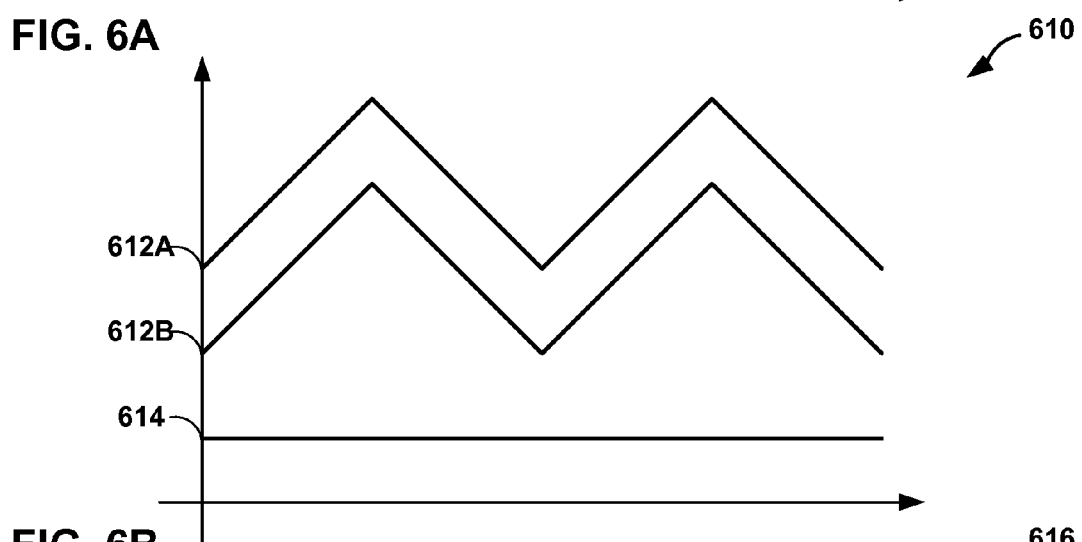

As illustrated in FIG. 6B, graph 610 may include a horizontal axis representing time, a vertical axis representing voltage, first plot 612A illustrating a first voltage signal, second plot 612B illustrating a second voltage signal, and third plot 614 illustrating a third voltage signal. In some examples, the first voltage signal and the second voltage signal may be a differential voltage signal. In some examples, the first voltage signal may represent the signal received at $V_{IN+}$ 501 of FIG. 5. In some examples, the second voltage signal may represent the signal received at $V_{IN-}$ 502 of FIG. 5. In some examples, the third voltage signal may represent the common mode voltage signal received at $V_{CM}$ 507 of FIG. 5. As illustrated in the example of FIG. 6B, the differential input signal received by circuit 500 of FIG. 5 may include a constant differential voltage $V_{IN+}-V_{IN}$, superimposed onto a triangular waveform.

Figure 6C:
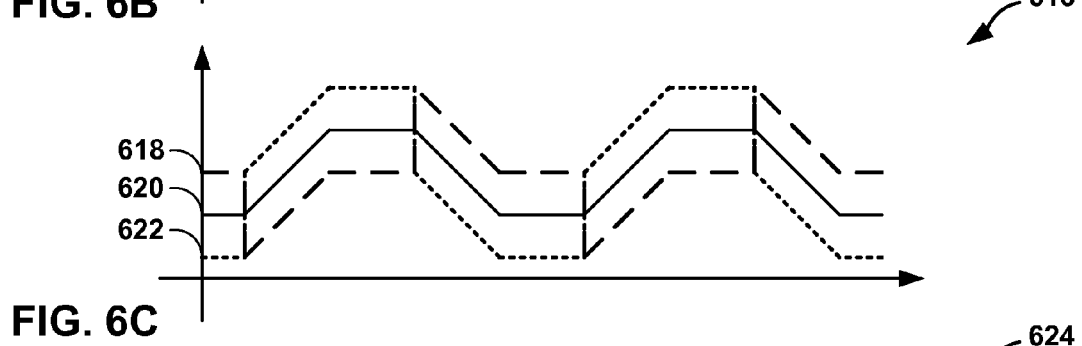

As illustrated in FIG. 6C, graph 616 may include a horizontal axis representing time, a vertical axis representing voltage, first plot 618 (long dashes) illustrating a first voltage signal, second plot 620 (solid line) illustrating a second voltage signal, and third plot 622 (short dashes) illustrating a third voltage signal. In some examples, the first voltage signal may represent the voltage across capacitor 510 of FIG. 5. In some examples, the second voltage signal may represent an average of the voltage across capacitor 510 and capacitor 516 of FIG. 5. In some examples, the third voltage signal may represent the voltage across capacitor 516 of FIG. 5.

Figure 6D:
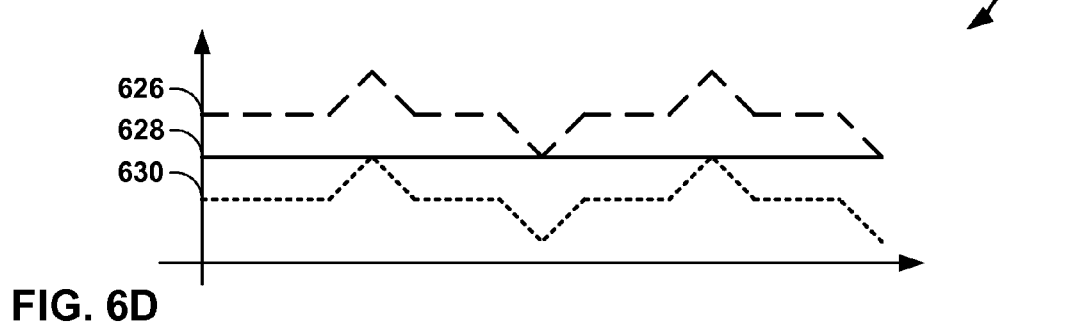

As illustrated in FIG. 6D, graph 624 may include a horizontal axis representing time, a vertical axis representing voltage, first plot 626 (long dashes) illustrating a first voltage signal, second plot 628 (solid line) illustrating a second voltage signal, and third plot 630 (short dashes) illustrating a third voltage signal. In some examples, the first voltage signal and the second voltage signal may be a differential voltage signal. In some examples, the first voltage signal may represent the signal output at $V_{OUT+}$ 503 of FIG. 5. In some examples, the second voltage signal may represent the common mode voltage signal received at $V_{CM}$ 507 of FIG. 5. In some examples, the third voltage signal may represent the signal output at $V_{OUT-}$ 504 of FIG. 5.

Figure 7:
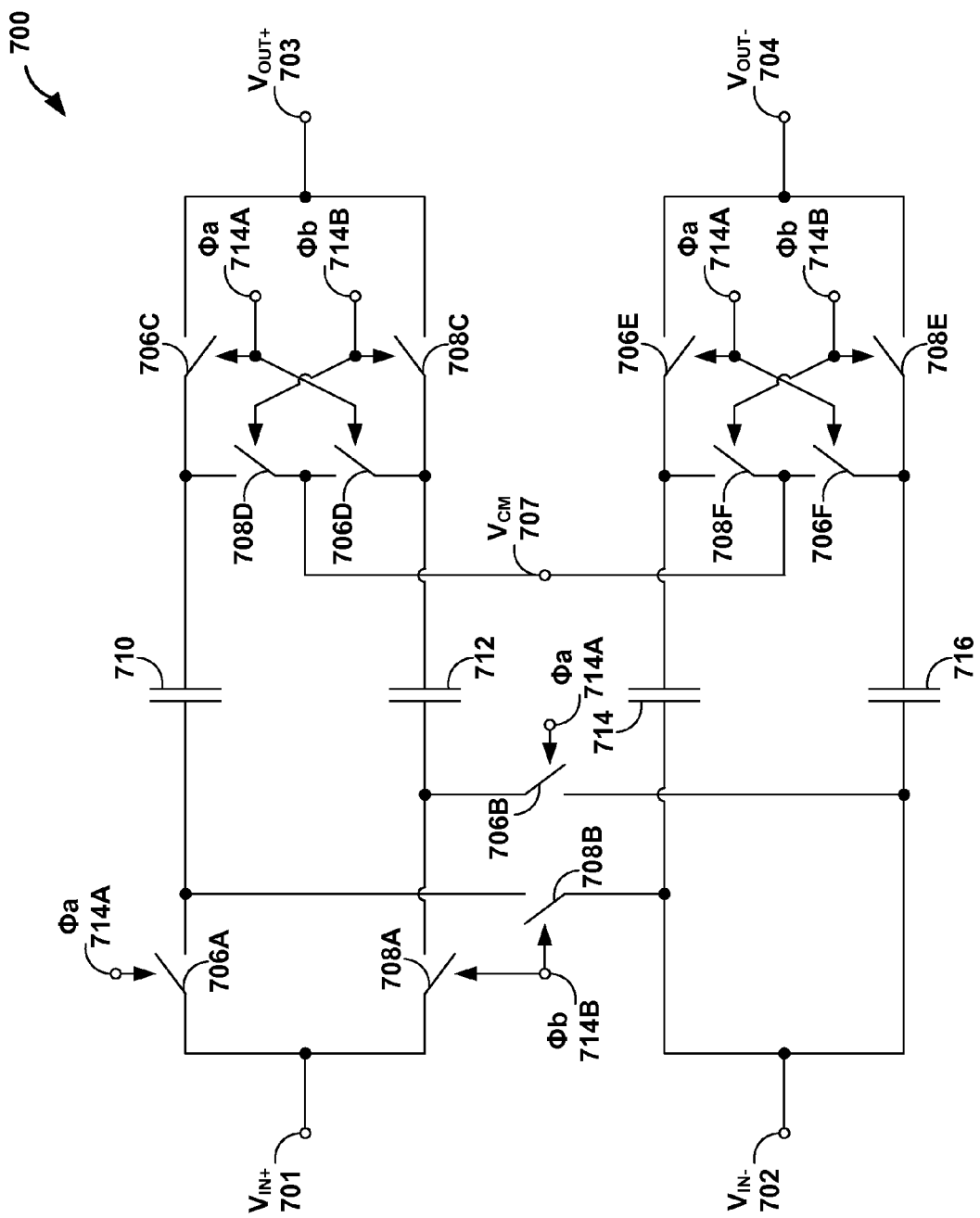
FIG. 7 is a circuit diagram illustrating another example circuit for controlling the common mode of a differential signal, in accordance with one or more techniques of this disclosure.

FIG. 7 is a circuit diagram illustrating an example circuit 700 that may output a differential signal with a selected common mode, in accordance with one or more techniques of this disclosure. As illustrated in FIG. 7, circuit 700 includes input 701 ($V_{IN+}$), input 702 ($V_{IN-}$), output 703 ($V_{OUT+}$), output 704 ($V_{OUT-}$), switches 706A-706F (collectively "switches 706"), common mode input 707 ($V_{CM}$), switches 708A-708F (collectively "switches 708"), capacitor 710, capacitor 712, capacitor 714, capacitor 716, clock line Φa 714A, and clock line Φb 714B.

Circuit 700 may perform similar operations to circuit 300 of FIG. 3. For instance, circuit 700 receive a differential input signal ($V_{IN+}-V_{IN-}$) corresponding to the difference between input 701 and input 702 and produce a differential output signal ($V_{OUT-}-V_{OUT+}$) corresponding to the difference between output 703 and output 704. The differential input signal may include an input common mode signal. Circuit 700 may be configured to remove the common mode input signal from the differential input signal ($V_{IN+}-V_{IN-}$) and output the differential output signal ($V_{OUT-}-V_{OUT+}$) such that it includes the common mode received at common mode input 707. Additionally, the differential output signal ($V_{OUT-}-V_{OUT+}$) may be output such that it closely matches the differential input signal ($V_{IN+}-V_{IN-}$).

As will be explained in greater detail below, the signals at Φa 714A and Φb 714B may represent complementary non-overlapping phases which may be generated from a reference clock, meaning Φa is high when Φb is low, and Φa is low when Φb is high. Thus, all of switches 706 are either simultaneously open or simultaneously closed. Switches 708 are likewise all either simultaneously open or simultaneously closed. Switches 706 and switches 708, however, may be opened and closed on opposite, complimentary phases. Thus, in some examples, switches 706 are opened when switches 708 are closed, and switches 706 are closed when switches 708 are open.

In some examples, capacitors 710-716 may be selected to generally have the same capacitance and are may be selected to have a high impedance. The signal at $V_{CM}$ 707 may represent a fixed voltage that circuit 700 may use as a reference.

The operation of circuit 700 will now be described with reference to several time periods (e.g. t=0, t=1, t=2, etc.). As will be described in more detail below, the time periods may be either periodic or aperiodic depending on implementation. In some implementations, all periods may be of equal duration, while in other implementations the periods may be of varying duration. In some implementations, all even periods may be of an equal duration and all odd periods of an equal duration, but the even periods may be of different duration than the odd periods.

At t=1, it can be assumed that the signal at Φa 714A is high and the signal at Φb 714B is low, meaning switches 706 are closed and switches 708 are open. At t=1, it can also be assumed that capacitors 710-716 store a voltage determined at t=0, meaning circuit 700 was in operation prior to t=1. As will be explained in more detail below, the voltage stored at capacitors 710-716 is based on values a difference between $V_{IN-}$ and $V_{CM}$. In the following equations, the subscripts t0, t1, t2, etc. are intended to represent values at t=0, t=1, t=2, etc. In the following equations, $V_{CM}$ is a fixed voltage produced at $V_{CM}$ 707, and thus does not vary from period to period.

When switches 706 are closed, $V_{IN+}$ 701 is connected to output $V_{OUT+}$ 703 through a path that includes switch 706A, capacitor 710, and switch 706C. Thus, at t=1, the voltage signal at $V_{OUT+}$ 703 may be represented by equation (24) below.

$$V_{OUT+_{t1}} = V_{IN-_{t1}} - V_{714_{t1}} \quad (24)$$

Where $V_{710_{t1}}$ represents the voltage stored across capacitor 710 at t=0. As will be explained in greater detail below, the voltage of capacitor 710 that is determined at t=0 is the value stored at capacitor 710 during t=1. As capacitor 710 may be characterized by a high impedance, capacitor 710 may behave like a floating battery when connected to output $V_{OUT+}$ 703.

Also, when switches 706 are closed, $V_{IN-}$ 702 is connected to output $V_{OUT-}$ 704 through a path that includes capacitor 714 and switch 706E. Thus, at t=1, the voltage signal at output $V_{OUT-}$ 704 may be represented by equation (25) below.

$$V_{OUT-_{t1}} = V_{IN-_{t1}} - V_{714_{t1}} \quad (25)$$

Where $V_{714_{t1}}$ represents the voltage stored across capacitor 710 at t=0. As with capacitor 710, the voltage of capacitor 714 that is determined at t=0 is the value stored at capacitor 714 during t=1. As capacitor 714 may be characterized by a high impedance, capacitor 714 may behave like a floating battery when connected to output $V_{OUT-}$ 704.

As introduced above, the voltages stored at capacitor 710 and capacitor 714 are based on values of $V_{IN-}$ at a different time instance. For example, when t=1, the values of $V_{710}$ and $V_{714}$ are based on the value of $V_{IN-}$ at t=0, according to equations (26) and (27).

$$V_{710_{t1}} = V_{IN-_{t0}} - V_{CM} \quad (26)$$

$$V_{714_{t1}} = V_{IN-_{t0}} - V_{CM} \quad (27)$$

Substituting $V_{710_{t1}}$ of equation (26) into equation (24) leads to equation (28) below.

$$V_{OUT+_{t1}} = V_{IN+_{t1}} - V_{IN-_{t0}} + V_{CM} \quad (28)$$

Substituting $V_{714_{t1}}$ of equation (27) into equation (25) leads to equation (29) below, assuming $V_{IN-_{t1}} \approx V_{IN-_{t1}}$.

$$V_{OUT-_{t1}} = V_{IN-_{t1}} - V_{IN-_{t0}} + V_{CM} = V_{CM} \quad (29)$$

By combining equations (28) and (29), the differential output between outputs $V_{OUT+}$ 703 and $V_{OUT-}$ 704 can be represented by equation (30).

$$V_{OUT+_{t1}} - V_{OUT-_{t1}} = V_{IN+_{t1}} - V_{IN-_{t1}} + V_{CM} - V_{CM} = V_{IN+_{t1}} - V_{IN-_{t1}} \quad (30)$$

Thus, as shown by equation (30), circuit 700 produces a differential output ($V_{OUT+}$, $V_{OUT-}$) between outputs $V_{OUT+}$ 703 and $V_{OUT-}$ 704 that is equal to, or approximately equal to, the differential input ($V_{IN+}-V_{IN-}$) at inputs $V_{IN+}$ 701 and $V_{IN-}$ 702. In this way, circuit 700 may shift the common mode of the differential signal to a value of $V_{CM}$ and removed the input common mode from the differential signal.

At t=1, while Φa is high and Φb is low, circuit 700 is also storing, at capacitors 712 and 716, values $V_{712_{t1}}$ and $V_{716_{t1}}$, respectively, which may be used by circuit 700 at t=2, when Φa is low and Φb is high. At t=1, while Φa is high and Φb is low, input $V_{IN-}$ 702 is connected to $V_{CM}$ 707 through a path that includes switch 706B, capacitor 712, and switch 706D. Input $V_{IN-}$ 702 is also connected to $V_{CM}$ 307 through a path that includes capacitor 716 and switch 706F. Thus the values of $V_{712}$ and $V_{716}$ at t=1 are as follows:

$$V_{712_{t1}} = V_{IN-_{t1}} - V_{CM} \quad (31)$$

$$V_{716_{t1}} = V_{IN-_{t1}} - V_{CM} \quad (32)$$

At t=2, while Φa is low and Φb is high, then switches 706 are open, and switches 708 are closed. When switches 708 are closed, then input 701 is connected to output 703 through a path that includes switch 708A, capacitor 712, and switch 708C. Thus, at t=2, the voltage at output 703 may be shown by equation (33) below, where $V_{712_{t2}}$ represents the voltage stored across capacitor 712.

$$V_{OUT+_{t2}} = V_{IN+_{t2}} - V_{712_{t2}} \quad (33)$$

When switches 708 are closed, then input 702 is connected to output 704 through a path that includes capacitor 716 and switch 708E. Thus, at t=2, the voltage at output 704 may be shown by equation (34) below.

$$V_{OUT-_{t2}} = V_{IN-_{t2}} - V_{716_{t2}} \quad (34)$$

This disclosure may generally use the term output path to refer to a path that connects an input (e.g. input 701 and input 702) to an output (e.g. output 703 and output 704). This disclosure may generally use the term $V_{CM}$ path to refer to a path that connects an input (e.g. input 701 and input 702) to a $V_{CM}$ input (e.g. $V_{CM}$ 707). As illustrated by the examples above, at t=1 when Φa is high and Φb is low, then capacitor 712 is part of a $V_{CM}$ path that connects input 702 to $V_{CM}$ 707 through switch 706B, capacitor 712, and switch 706D. At t=2, capacitor 712 is part of an output path that connects input 701 to output 703 through switch 708A, capacitor 712, and switch 708C. Similarly, at t=1 when Φa is high and Φb is low, then capacitor 716 is part of a $V_{CM}$ path that connects input 702 to $V_{CM}$ 707 through capacitor 716 and switch 706F. At t=2, capacitor 716 is part of an output path that connects input 702 to output 704 through capacitor 716 and switch 708E.

Capacitors 710 and 714 alternate between being part of $V_{CM}$ paths and output paths in the same manner as capacitors 712 and 716, but capacitors 710 and 714 are out of phase with capacitors 712 and 716. Thus, while capacitors 712 and 716 are part of $V_{CM}$ paths at t=1 and part of output paths at t=2, capacitors 710 and 714 are part of output paths at t=1 and are part of $V_{CM}$ paths at t=2. As illustrated by the examples above, at t=1 when Φa is high and Φb is low, then capacitor 710 is part of an output path that connects input 701 to output 703 through switch 706A, capacitor 710, and switch 706C. At t=2 when Φa is low and Φb is high, then capacitor 710 is part of a $V_{CM}$ path that connects input 702 to $V_{CM}$ 707 through switch 708B, capacitor 710, and switch 708D. At t=1 when Φa is high and Φb is low, then capacitor 714 is part of an output path that connects input 702 to output 704 through capacitor 714 and switch 706E. At t=2 when Φa is low and Φb is high, then capacitor 714 is part of a VCM path that connects input 702 to $V_{CM}$ 707 through capacitor 714 and switch 708F.

The voltages stored at capacitors 710-716 may vary based on VINN when capacitors 710-716 are part of a VCM path, but the voltages remain constant, or virtually constant, when capacitors 710-716 are part of an output path. Thus, value of $V712_{t2}$, when capacitor 712 is part of an output path, can be assumed to be equal to the value $V712_{t1}$ at the time of the transition from Φa from high to low and Φb from low to high. Accordingly, the values of $V712_{t2}$ and $V716_{t2}$ are as follows:

$$V_{712_{t2}} = V_{712_{t1}} = V_{IN-_{t1}} - V_{CM} \quad (35)$$

$$V_{716_{t2}} = V_{716_{t1}} = V_{IN-_{t1}} - V_{CM} \quad (36)$$

Substituting $V712_{t2}$ of equation (35) into equation (33) leads to equation (37) below.

$$V_{OUT+_{t2}} = V_{IN+_{t2}} - V_{IN-_{t1}} + V_{CM} \quad (37)$$

Substituting $V716_{t2}$ of equation (36) into equation (34) leads to equation (38) below, assuming VIN-t2≈VIN-t1.

$$V_{OUT-_{t2}} = V_{IN-_{t2}} - V_{IN-_{t1}} + V_{CM} = V_{CM} \quad (38)$$

By combining equations (37) and (38), the differential output between outputs 703 and 704 can be shows as follows:

$$V_{OUT+_{t2}} - V_{OUT-_{t2}} = V_{IN+_{t2}} - V_{IN-_{t2}} + V_{CM} - V_{CM} = V_{IN+_{t2}} - V_{IN-_{t2}} \quad (39)$$

Thus, as shown by equation (39), circuit 700, at t=2, produces a differential output ($V_{OUT+} - V_{OUT-}$) between outputs 703 and 704 that is equal to, or approximately equal to, the differential input ($V_{IN+} - V_{IN-}$) at inputs 701 and 702.

At t=2, while Φa is low and Φb is high, circuit 700 is also storing, at capacitors 710 and 714, values $V712_{t2}$ and $V716_{t2}$, respectively, which will be used by circuit 700 at t=3, when Φa is high and Φb is low. At t=2, while Φa is low and Φb is high, input 702 is connected to $V_{CM}$ 707 through a path that includes switch 708B, capacitor 710, and switch 708D. Input 702 is also connected to $V_{CM}$ 707 through a path that includes capacitor 714 and switch 708F. Thus the values of $V_{712}$ and $V_{716}$ at t=2 are follows:

$$V_{710_{t2}} = V_{IN-_{t1}} - V_{CM} \quad (40)$$

$$V_{740_{t2}} = V_{IN-_{t1}} - V_{CM} \quad (41)$$

As described above, capacitors 710 and 714 alternate between being part of $V_{CM}$ paths and part of output paths, and capacitors 712 and 716, likewise, alternate between being part of $V_{CM}$ paths and part of output paths. When part of $V_{CM}$ paths, capacitors 710-716 store a difference between $V_{IN-}$ and $V_{CM}$. When part of output paths, capacitors 710-716 add their stored voltage to the input voltages.

As shown in equations (29) and (38), circuit 700 achieves a differential output ($V_{OUT+} - V_{OUT-}$) between outputs 703 and 704 that is equal to, or approximately equal to, the differential input ($V_{IN+} - V_{IN-}$) based on $V_{IN-}$ at time t being approximately equal to $V_{IN-}$ at time t−1. For circuit 700, obtaining values of $V_{IN-}$ at time t that are sufficiently equal to $V_{IN-}$ at time t−1 may be achieved by selecting a reference clock signal with a sufficiently high frequency. Generally speaking, the more quickly Φa and Φb alternate between high and low, the more closely $V_{IN-}$ at time t will approximate $V_{IN-}$ at time t−1. Thus, when implementing the techniques described with respect to circuit 700, a circuit designer may identify a desired clock frequency for circuit 700 that achieves desirable results.

The clock frequency for circuit 700 may be fixed, as described above, but the clock frequency may also be variable. In one example, the clock frequency may be variable based on comparing $V_{IN-}$ to $V_{CM}$. Adding circuitry for varying the clock frequency may result in added circuit complexity by requiring more components, but at the same time, having the clock be variable may also reduce power consumption by enabling circuit 700 to run at a lower clock speed.

FIGS. 8A-8E are graphs illustrating various signals of an example circuit for controlling the common mode of a differential signal, in accordance with one or more techniques of this disclosure. As illustrated in FIG. 8A, graph 802 may include first plot 804 illustrating a first digital signal. In some examples, the first digital signal may represent the signal received at Φa 714A of circuit 700 of FIG. 7.

As illustrated in FIG. 8B, graph 806 may include first plot 808 illustrating a first voltage signal, second plot 810 illustrating a second voltage signal, and third plot 812 illustrating a third voltage signal. In some examples, the first voltage signal may represent the signal received at $V_{IN+}$ 701 of circuit 700 of FIG. 7. In some examples, the second voltage signal may represent the signal received at $V_{IN-}$ 702 of circuit 700 of FIG. 7. In some examples, the third voltage signal may represent the signal at the first terminal of capacitor 710 (i.e., the terminal that is alternately connected to switch 706A and switch 708B) of circuit 700 of FIG. 7.

As illustrated in FIG. 8C, graph 814 may include first plot 816 illustrating a first voltage signal, and second plot 818 illustrating a second voltage signal. In some examples, the first voltage signal may represent the signal at $V_{OUT-}$ 704 of circuit 700 of FIG. 7. In some examples, the second voltage signal may represent the signal received at $V_{OUT+}$ 703 of circuit 700 of FIG. 7.

As illustrated in FIG. 8D, graph 820 may include first plot 822 illustrating a first voltage signal, and second plot 824 illustrating a second voltage signal. In some examples, the first voltage signal may represent the voltage across capacitor 710 of circuit 700 of FIG. 7. In some examples, the second voltage signal may represent the voltage across capacitor 712 of circuit 700 of FIG. 7.

As illustrated in FIG. 8E, graph 826 may include first plot 828 illustrating a first differential voltage signal, and second plot 830 illustrating a second differential voltage signal. In some examples, the first differential voltage signal may represent the difference between the signal received at $V_{IN+}$ 701 of circuit 700 of FIG. 7 and the signal received at $V_{IN-}$ 702 of circuit 700 of FIG. 7. In some examples, the second differential voltage signal may represent the difference between the signal received at $V_{OUT+}$ 703 of circuit 700 of FIG. 7 and the signal received at $V_{OUT-}$ 704 of circuit 700 of FIG. 7. As illustrated in FIG. 8E, first plot 828 and second plot 830 may substantially overlap. In some examples, first plot 828 and second plot 830 may overlap perfectly.

Figure 9:
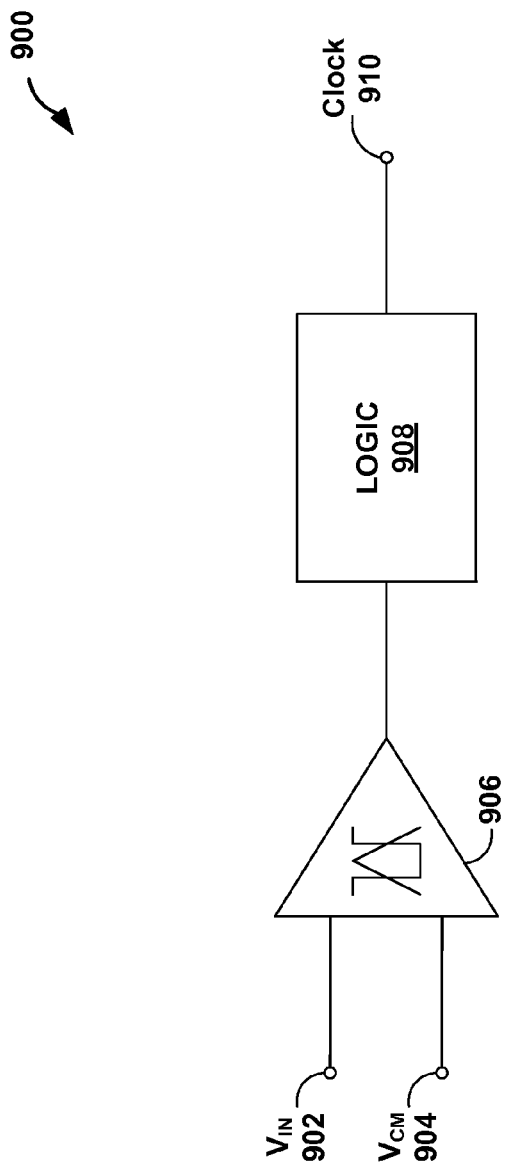
FIG. 9 is a circuit diagram illustrating one example of an auxiliary comparator 900 that may be used to monitor a voltage level, in accordance with one or more techniques of this disclosure.

FIG. 9 is a circuit diagram illustrating one example of an auxiliary comparator 900 that may be used to monitor a voltage level, in accordance with one or more techniques of this disclosure. Auxiliary comparator 900 may, for example, be used in conjunction with circuit 700 of FIG. 7 to control the transition of Φa and Φb from high to low and low to high. As illustrated in FIG. 9, auxiliary comparator 900 may include voltage input ($V_{IN}$) 902, $V_{CM}$ input 904, comparator 906, logic 908, and clock output 910.

In some examples, $V_{IN}$ 902 may be connected to a differential voltage output of another circuit. For instance, $V_{IN}$ 902 may be connected to $V_{OUT+}$ 703 or $V_{OUT-}$ 704 of circuit 700 of FIG. 7. In some examples, clock output 910 may be connected to a clock input of another circuit. For instance, clock output 910 may be connected to clock line Φa 714A. As another example, clock output 910 may be connected to clock line Φb 714B of FIG. 7 via an inverter such that the clock signal received at clock line Φb 714B is complimentary and non-overlapping to the clock signal received at clock line Φa 714A.

In some examples, auxiliary comparator 900 may include comparator 906 which may be configured to compare a first voltage level with a second voltage level. In some examples, comparator 906 may be a window comparator configured to compare a first voltage level with a window around a second window to determine whether the first voltage level is within the window. In some examples, responsive to determining that the first voltage level is not within the window, comparator 906 may be configured to output a signal. For instance, where $V_{IN}$ 902 is connected to $V_{OUT+}$ 703 of FIG. 7 and $V_{CM}$ 904 is connected to $V_{CM}$ 707 of FIG. 7, comparator 906 may be configured to output a signal to logic 908 in response to determining that the voltage level at $V_{OUT+}$ 703 has exceeded a window around the voltage level at $V_{CM}$ 707.

In some examples, auxiliary comparator 900 may include logic 908 which may be configured to output one or more clock signals. In some examples, logic 908 may be configured to toggle at least one of the clock signals in response to receiving the signal from comparator 906. For instance, in response to receiving a signal from 906 indicating first voltage level has exceeded the window around the second voltage level, logic 908 may toggle the logic level of the clock signal at clock output 910 from low to high (where the signal was low prior to the reception of the signal from comparator 906) or from high to low (where the signal was high prior to the reception of the signal from comparator 906). In this way, auxiliary comparator 900 may keep the input voltage levels within design limits. Also in this way, auxiliary comparator 900 may remove the dependence from the input signal dynamic.

In some examples, such as where the voltage signal received at $V_{IN}$ 902 is static, the circuit driven by the signal at clock output 910 may remove the input common mode after the first sampling cycle. In some examples, such as where the voltage signal received at $V_{IN}$ 902 is dynamic, auxiliary comparator 900 (in combination with the circuit driven by the signal at clock output 910, e.g., circuit 300) may cause the output common mode to be restored by sampling $V_{IN-}$-$V_{CM}$ in the capacitors as soon as the voltage level at $V_{IN}$ 902 exceeds the allowed window. In some examples, this asynchronous operating mode may optimize power consumption and minimize the output common mode variations.

Figure 10:
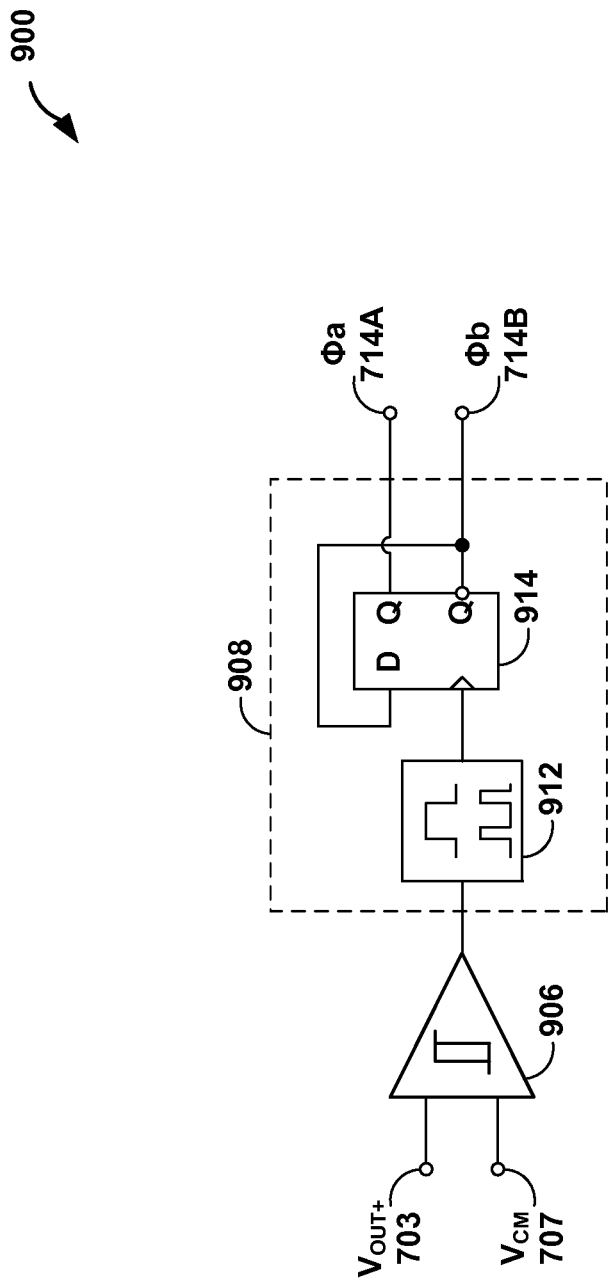
FIG. 10 is a circuit diagram illustrating further details of an example of auxiliary comparator 900 that may be used to monitor a voltage level, in accordance with one or more techniques of this disclosure.

FIG. 10 is a circuit diagram illustrating further details of an example of auxiliary comparator 900 that may be used to monitor a voltage level, in accordance with one or more techniques of this disclosure. As illustrated in FIG. 10, auxiliary comparator 900 may include $V_{OUT+}$ input 703, $V_{CM}$ input 707, comparator 906, logic 908, clock output Φa 714A, and clock output Φb 714B.

The operation and features of $V_{OUT+}$ input 703, $V_{CM}$ input 707, clock output Φa 714A, and clock output Φb 714B are described above with reference to circuit 700 of FIG. 7. For instance, the signal at clock output Φa 714A may control the operation of switches 706 of FIG. 7, and the signal at clock output Φb 714B may control the operation of switches 708 of FIG. 7. The operation and features of comparator 906 are described above with reference to circuit 900 of FIG. 9.

The operation of circuit 900 will now be described with reference to several time periods (e.g. t=0, t=1, t=2, etc.). As will be described in more detail below, the time periods may be either periodic or aperiodic depending on implementation. In some implementations, all periods may be of equal duration, while in other implementations the periods may be of varying duration. In some implementations, all even periods may be of an equal duration and all odd periods of an equal duration, but the even periods may be of different duration than the odd periods.

At t=1, it can be assumed that the signal at Φa 714A is high and the signal at Φb 714B is low, meaning that switches 706 are closed and switches 708 are open. When comparator 906 determines that the voltage level at $V_{OUT+}$ 703 has exceeded a window around the voltage level at $V_{CM}$, comparator 906 may output a signal to pulse generator 912. Pulse generator 912 may receive the signal from comparator 906 and output a logic high pulse to flip flop 914. Responsive to receiving the pulse, flip flop 914 may toggle the clock signals (i.e., Φa 714A and Φb 714B). In this way, auxiliary comparator 900 may keep the input voltage levels within design limits. Also in this way, auxiliary comparator 900 may remove the dependence from the input signal dynamic.

FIGS. 11A-11E are graphs illustrating various signals of an example circuit for controlling the common mode of a differential signal, in accordance with one or more techniques of this disclosure. As illustrated in FIG. 11A, graph 1102 may include first plot 1104 illustrating a digital signal. In some examples, the digital signal may represent the clock signal Φa output by flip flop 914 at clock line Φa 714A of auxiliary comparator 900 of FIG. 10.

As illustrated in FIG. 11B, graph 1106 may include first plot 1108 illustrating a first voltage signal, second plot 1110 illustrating a second voltage signal, and third plot 1112 illustrating a third voltage signal. In some examples, the first voltage signal may represent the signal received at $V_{IN+}$ 701 of circuit 700 of FIG. 7. In some examples, the second voltage signal may represent the voltage at the first terminal of capacitor 710 of FIG. 7. In some examples, the third voltage signal may represent the signal received at $V_{IN-}$ 702 of circuit 700 of FIG. 7.

As illustrated in FIG. 11C, graph 1114 may include first plot 1116 illustrating a first voltage signal, second plot 1118 illustrating a second voltage signal, third plot 1120 illustrating a third voltage signal, and fourth plot 1122 illustrating a fourth voltage signal. In some examples, the first voltage signal may represent the signal at $V_{OUT-}$ 704 of circuit 700 of FIG. 7. In some examples, the second voltage signal may represent the signal at $V_{OUT+}$ 703 of circuit 700 of FIG. 7. In some examples, the third voltage signal may represent the upper bound of the window used by comparator 906 of circuit 700 of FIG. 7. In some examples, the fourth voltage signal may represent the lower bound of the window used by comparator 906 of circuit 700 of FIG. 7.

As illustrated in FIG. 11D, graph 1124 may include first plot 1126 illustrating a first voltage signal, and second plot 1128 illustrating a second voltage signal. In some examples, the first voltage signal may represent the voltage across capacitor 710 of circuit 700 of FIG. 7. In some examples, the second voltage signal may represent the voltage across capacitor 712 of circuit 700 of FIG. 7.

As illustrated in FIG. 11E, graph 1130 may include first plot 1132 illustrating a first differential voltage signal, and second plot 1134 illustrating a second differential voltage signal. In some examples, the first differential voltage signal may represent the difference between the signal at $V_{OUT+}$ 703 of circuit 700 of FIG. 7 and the signal at $V_{OUT-}$ 704 of circuit 700 of FIG. 7. In some examples, the second differential voltage signal may represent the difference between the signal at $V_{IN+}$ 701 of circuit 700 of FIG. 7 and the signal at $V_{IN-}$ 702 of circuit 700 of FIG. 7. As illustrated in FIG. 11E, first plot 1132 and second plot 1134 may substantially overlap. In some examples, first plot 1132 and second plot 1134 may overlap perfectly.

Figure 12:
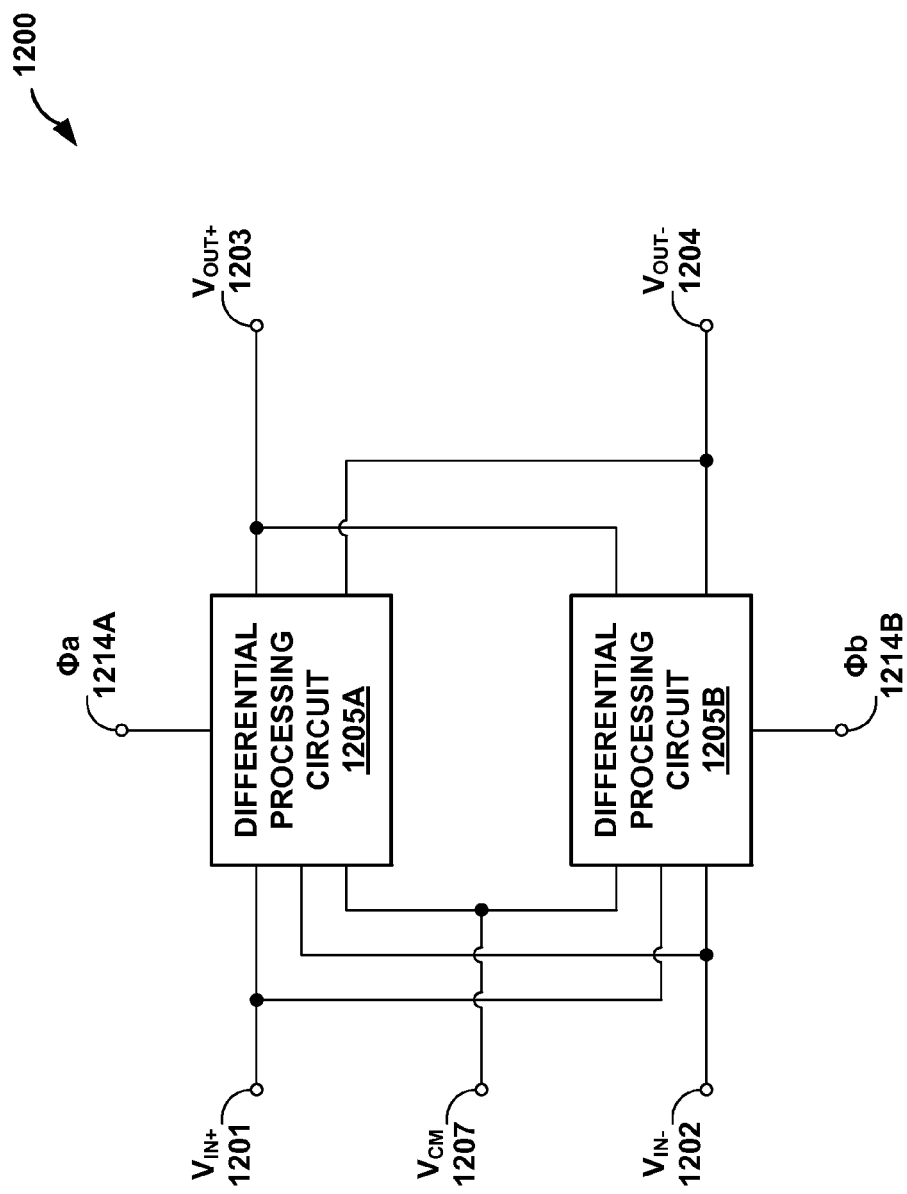
FIG. 12 is a circuit diagram illustrating example circuit 1200 for controlling the common mode of a differential signal, in accordance with one or more techniques of this disclosure.

FIG. 12 is a circuit diagram illustrating example circuit 1200 for controlling the common mode of a differential signal, in accordance with one or more techniques of this disclosure. Circuit 1200 may include input $V_{IN+}$ 1201, input $V_{IN-}$ 1202, differential processing circuit 1205A, differential processing circuit 1205B (collectively, "differential processing circuits 1205"), input $V_{CM}$ 1207, clock input Φa 1214A, clock input Φb 1214B, output $V_{OUT+}$ 1203, and $V_{OUT-}$ 1204.

801 and 802, outputs 803 and 804, and VCM 807. Circuit 1200 may receive a differential input signal ($V_{IN+}$–$V_{IN-}$) corresponding to the difference between input 1201 and input 1202 and produces a differential output signal ($V_{OUT-}$–$V_{OUT+}$) corresponding to the difference between output 1203 and output 1204. Circuit 1200 may be configured to remove the variance of the common mode voltage from the differential input signal, such that differential input signal more closely matches differential output signal.

Differential processing circuit 1205A and differential processing circuit 1205B may, for example, each correspond to circuit 400 of FIG. 4, circuit 500 of FIG. 5, or circuit 700 of FIG. 7. In other words, differential processing circuits 1205 may each have the same capacitor and switch arrangement as shown in FIG. 4, the same capacitor and switch arrangement as shown in FIG. 5, or the same capacitor and switch arrangement as shown in FIG. 7.

Circuit 1200 may also include a non-overlapping clock generator (not shown in FIG. 12) that creates two phases, Φa and Φb, shifted by 180°. The two clock phases may be respectively received at clock input Φa 1214A, and clock input Φb. Thus, differential processing circuit 1205A operates 180° out of phase with differential processing circuit 1205B.

In a first phase, when differential processing circuit 1205A is forming output paths between inputs 1201 and 1202 and outputs 1203 and 1204, differential processing circuit 1205B is forming $V_{CM}$ paths between input 1202 and $V_{CM}$ 1207. In a second phase, when differential processing circuit 1205A is forming $V_{CM}$ paths between input 1202 and $V_{CM}$ 1207, differential processing circuit 1205B is forming output paths between inputs 1201 and 1202 and outputs 1203 and 1204. The output paths and $V_{CM}$ paths formed by differential processing circuits 1205 generally correspond to the same output paths and $V_{CM}$ paths described above with respect to FIG. 7. Each of the differential processing circuits 1205 may alternate between a sampling phase and a coupling phase. However, because differential processing circuit 1205A operates 180° out of phase with differential processing circuit 1205B, circuit 1200 may produce continuous, or near-continuous output signals across outputs 1203 and 1204.

Figure 13:
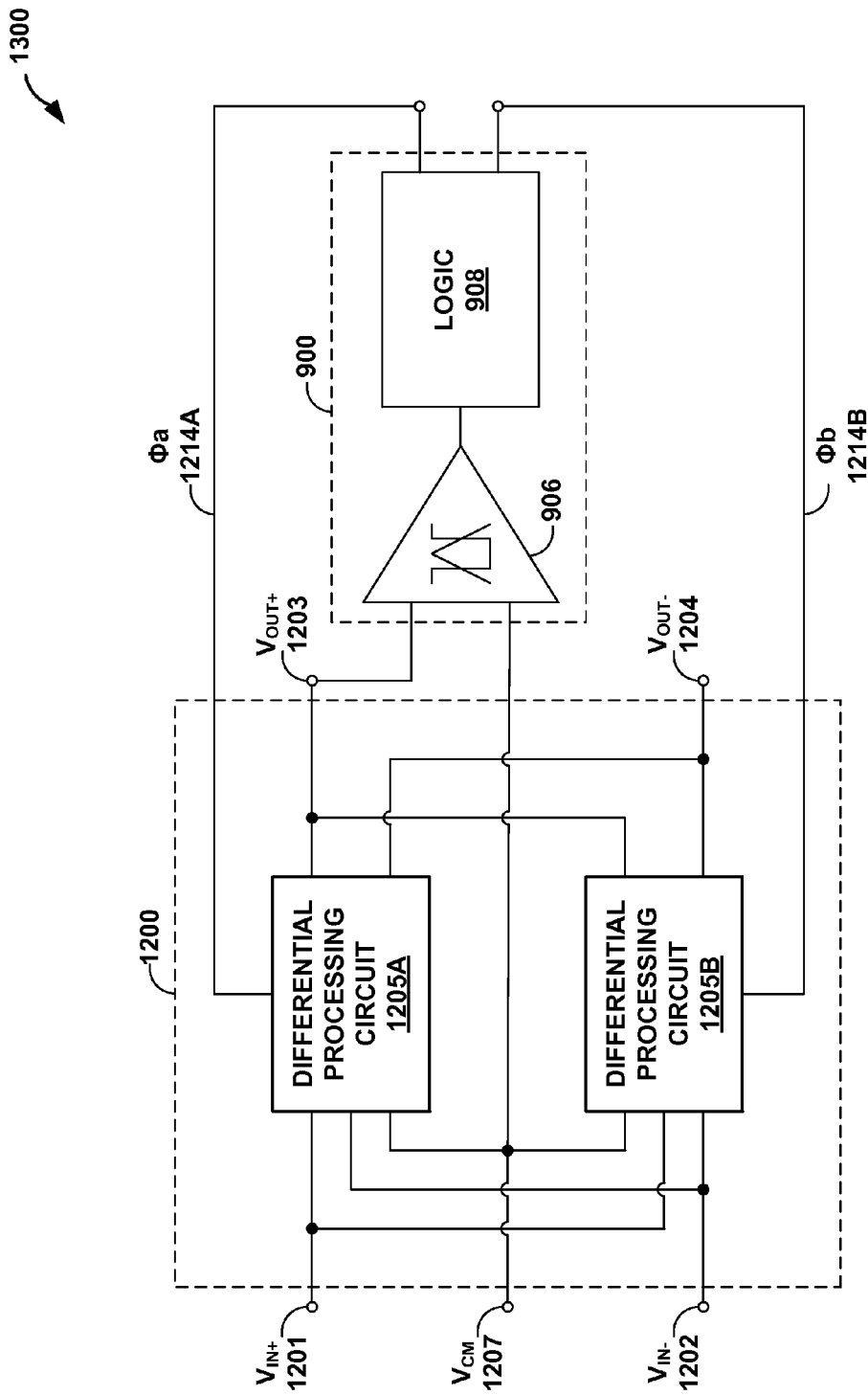
FIG. 13 is a circuit diagram illustrating example circuit 1300 for controlling the common mode of a differential signal, in accordance with one or more techniques of this disclosure.

FIG. 13 is a circuit diagram illustrating example circuit 1300 for controlling the common mode of a differential signal, in accordance with one or more techniques of this disclosure. As illustrated by FIG. 13 circuit 900 may be attached to circuit 1200 to generate complimentary non-overlapping clock signal Φa 1214A, and clock signal Φb 1214B. In some examples, $V_{OUT-}$ 1204 of circuit 1200 may also be connected to comparator 906 of circuit 900. In such examples, comparator 906 may compare the output common mode voltage (vop+ von)/2 or a signal proportional to it with the fixed voltage $V_{CM}$. In this way, circuit 1300 may reduce the maximum variation of the output common mode with reference to the fixed reference $V_{CM}$ by triggering the input sampling when necessary. Each of the differential processing circuits 1205 may alternate between an acquisition mode and a tracking mode. However, because differential processing circuit 1205A operates 180° out of phase with differential processing circuit 1205B, circuit 1200 may produce continuous, or near-continuous output signals across outputs 1203 and 1204.

Figure 14:
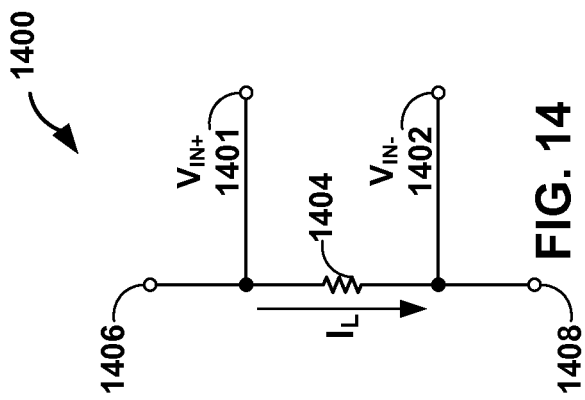
FIG. 14 is a circuit diagram illustrating example circuit 1400 for measuring a differential signal, in accordance with one or more techniques of this disclosure.

FIG. 14 is a circuit diagram illustrating example circuit 1400 for measuring a differential signal, in accordance with one or more techniques of this disclosure. As illustrated in FIG. 14, circuit 1400 may include resistor 1404 positioned between circuit node 1406 and circuit node 1408, voltage output $V_{IN+}$ 1401, and voltage output $V_{IN-}$ 1402.

In some examples, resistor 1404 may be a sense resistor the voltage across which is proportional to the current $I_L$ by the resistance value of resistor 1404. In accordance with one or more techniques of this disclosure, a circuit may receive the differential voltage signal (i.e., the voltage signal across voltage output $V_{IN+}$ 1401, and voltage output $V_{IN-}$ 1402), and determine the amount of current flowing through resistor 1404. For instance, circuit 300 of FIG. 3, circuit 400 of FIG. 4, circuit 500 of FIG. 5, circuit 700 of FIG. 7, or circuit 1200 of FIG. 12 may receive the differential voltage signal, remove the common mode of the differential voltage signal, and output the differential voltage signal with a common mode received at $V_{CM}$ (respectively, $V_{CM}$ 307, $V_{CM}$ 407, $V_{CM}$ 507, $V_{CM}$ 707, and $V_{CM}$ 1207).

Figure 15:
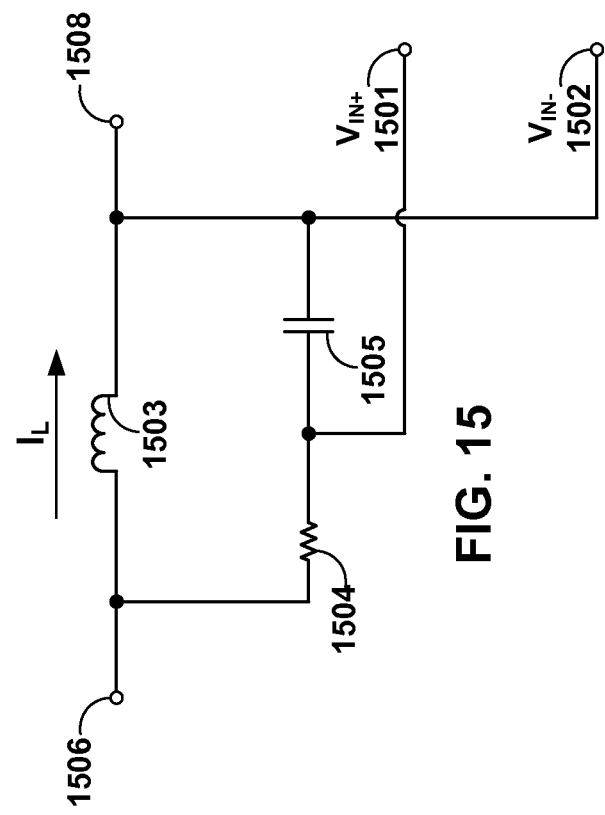
FIG. 15 is a circuit diagram illustrating example circuit 1500 for measuring a differential signal, in accordance with one or more techniques of this disclosure.

FIG. 15 is a circuit diagram illustrating example circuit 1500 for measuring a differential signal, in accordance with one or more techniques of this disclosure. As illustrated in FIG. 15, circuit 1500 may include inductor 1503 positioned between circuit node 1506 and circuit node 1508, resistor 1504 and capacitor 1505 positioned in series across circuit node 1506 and circuit node 1508, voltage output $V_{IN+}$ 1501, and voltage output $V_{IN-}$ 1502.

In some examples, inductor 1503 may be included in a switching power regulator. In accordance with one or more techniques of this disclosure, a circuit may receive the differential voltage signal (i.e., the voltage signal across voltage output $V_{IN+}$ 1501, and voltage output $V_{IN-}$ 1502), and determine the amount of current flowing through inductor 1503. For instance, circuit 300 of FIG. 3, circuit 400 of FIG. 4, circuit 500 of FIG. 5, circuit 700 of FIG. 7, or circuit 1200 of FIG. 12 may receive the differential voltage signal, remove the common mode of the differential voltage signal, and output the differential voltage signal with a common mode received at $V_{CM}$ (respectively, $V_{CM}$ 307, $V_{CM}$ 407, $V_{CM}$ 507, $V_{CM}$ 707, and $V_{CM}$ 1207).

In some examples, a system may include a plurality of circuits, each comprising an input circuit (e.g., circuit 1400 of FIG. 14, and circuit 1500 of FIG. 15), a circuit (e.g., circuit 300 of FIG. 3, circuit 400 of FIG. 4, circuit 500 of FIG. 5, circuit 700 of FIG. 7, or circuit 1200 of FIG. 12). For instance, a multiphase switching regulator may comprise a controller, a plurality of power stages that each include an inductor (e.g., inductor 1503), an R-C network for sensing the current flowing through each inductor, and a circuit (e.g., circuit 300 of FIG. 3, circuit 400 of FIG. 4, circuit 500 of FIG. 5, circuit 700 of FIG. 7, or circuit 1200 of FIG. 12) configured to controlling the common mode of the differential signal.

Figure 16:
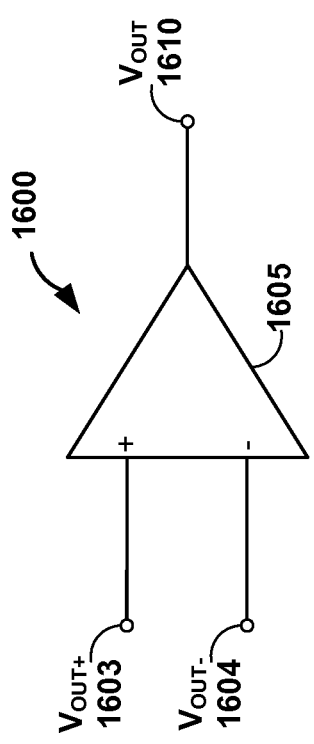
FIG. 16 is a circuit diagram illustrating example circuit 1600 for processing a differential signal, in accordance with one or more techniques of this disclosure.

FIG. 16 is a circuit diagram illustrating example circuit 1600 for processing a differential signal, in accordance with one or more techniques of this disclosure. As illustrated in FIG. 16, circuit 1600 may include analog processing circuitry 1605, voltage input $V_{OUT+}$ 1603, voltage input $V_{OUT+}$ 1604, and output $V_{OUT}$ 1610.

In some examples, circuit 1600 may be attached to a circuit configured to remove and replace the common mode of a differential voltage signal (e.g., circuit 300 of FIG. 3, circuit 400 of FIG. 4, circuit 500 of FIG. 5, circuit 700 of FIG. 7, and circuit 1200 of FIG. 12). For instance, voltage input $V_{OUT+}$ 1603 and voltage input $V_{OUT+}$ 1604 may be respectively connected to the differential outputs of the circuit. In accordance with one or more techniques of this disclosure, analog processing circuitry 1605 of circuit 1600 may process the received differential voltage signal. In some examples, analog processing circuitry may include, but is not limited to, an amplifier, a gm stage, a buffer, and/or a filter. In some examples, circuit 1600 may be configured to output a processed differential signal.

Figure 17:
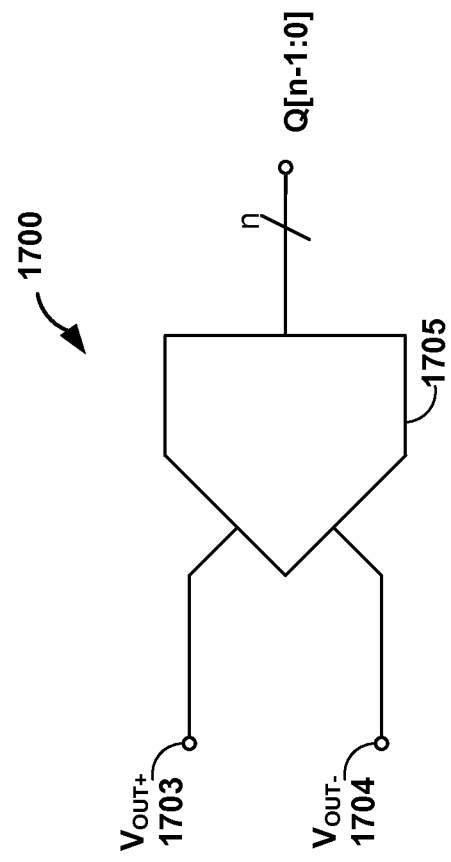
FIG. 17 is a circuit diagram illustrating example circuit 1700 for processing a differential signal, in accordance with one or more techniques of this disclosure.

FIG. 17 is a circuit diagram illustrating example circuit 1700 for processing a differential signal, in accordance with one or more techniques of this disclosure. As illustrated in FIG. 17, circuit 1700 may include analog to digital converter (ADC) 1705, voltage input $V_{OUT+}$ 1703, voltage input $V_{OUT+}$ 1704, and digital output 1710.

In some examples, circuit 1700 may be attached to a circuit configured to remove and replace the common mode of a differential voltage signal (e.g., circuit 300 of FIG. 3, circuit 400 of FIG. 4, circuit 500 of FIG. 5, circuit 700 of FIG. 7, and circuit 1200 of FIG. 12). For instance, voltage input $V_{OUT+}$ 1703 and voltage input $V_{OUT+}$ 1704 may be respectively connected to the differential outputs of the circuit. In accordance with one or more techniques of this disclosure, ADC 1705 of circuit 1700 may convert the received differential voltage signal into a digital value. For example, ADC 1705 may output a digital signal corresponding to the difference between the signals received at voltage input $V_{OUT+}$ 1703 and voltage input $V_{OUT+}$ 1704. As another example, ADC 1705 may output two digital signals, each respectively corresponding to the signals received at voltage input $V_{OUT+}$ 1703 and voltage input $V_{OUT+}$ 1704.

Example 1

A method comprising: receiving a first differential signal including a first voltage signal and a second voltage signal, wherein the first differential signal includes a first common mode voltage; receiving a second common mode voltage; determining, by a circuit, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage; and outputting, substantially continuously, the second differential signal.

Example 2

The method of example 1, wherein the circuit comprises a plurality of switches, wherein each switch of the plurality of switches is configured to switch between a plurality of states, and wherein the states of the plurality of switches are determined based on a clock signal.

Example 3

The method of any combination of examples 1-2, wherein outputting, substantially continuously, the second differential signal comprises: outputting the differential signal when a switch of the plurality of switches is in any state of the plurality of states; and not outputting the differential signal when the switch is switching amongst the plurality of states.

Example 4

The method of any combination of examples 1-4, further comprising: determining the clock signal by comparing the second common mode voltage to a voltage signal of the second differential signal.

Example 5

The method of any combination of examples 1-4, wherein determining the clock signal by comparing the second common mode voltage with the fourth voltage signal comprises: responsive to determining that a difference between the voltage signal of the second differential signal is greater than a threshold, toggling the clock signal.

Example 6

The method of any combination of examples 1-5, wherein the circuit further comprises a first capacitor and a second capacitor, wherein the first voltage signal is received at a first input pin, wherein the second voltage signal is received at a second input pin, wherein the second common mode voltage is received at a third input pin, wherein the third voltage signal is output at a first output pin, wherein the fourth voltage signal is output at a second output pin, wherein the second input pin is connected to a first terminal of the second capacitor, wherein the clock signal indicates a plurality of non-overlapping phases, wherein a second phase of the plurality of phases is substantially shorter than a first phase of the plurality of phases, and wherein determining the second differential voltage signal comprises: responsive to the clock signal indicating the first phase of the plurality of phases: connecting, by a first switch of the plurality of switches, a first terminal of the first capacitor to the first input pin; connecting, by a second switch of the plurality of switches, a second terminal of the first capacitor to the first output pin; and connecting, by a third switch of the plurality of switches, a second terminal of the second capacitor to the second output pin, and responsive to the clock signal indicating the second phase of the plurality of phases: connecting, by a fourth switch of the plurality of switches, the first terminal of the first capacitor to the second input pin; connecting, by a fifth switch of the plurality of switches, the second terminal of the first capacitor to the third input pin; and connecting, by a sixth switch of the plurality of switches, the second terminal of the second capacitor to the third input pin.

Example 7

The method of any combination of examples 1-6, wherein the circuit further comprises a third capacitor and a fourth capacitor, wherein a second terminal of the third capacitor is connected to the second terminal of the second capacitor, wherein a first terminal of the fourth capacitor is connected to the first input pin, wherein a second terminal of the fourth capacitor is connected to the second terminal of the first capacitor, and wherein determining the second differential voltage signal further comprises: responsive to the clock signal indicating the first phase of the plurality of phases: connecting, by a seventh switch of the plurality of switches, a first terminal of the third capacitor to the second input pin; responsive to the clock signal indicating the second phase of the plurality of phases: connecting, by an eighth switch of the plurality of switches, the first terminal of the third capacitor to the first input pin.

Example 8

The method of any combination of examples 1-6, wherein the circuit further comprises a third capacitor and a fourth capacitor, wherein a first terminal of the third capacitor is connected to the first terminal of the second capacitor, and wherein determining the second differential voltage signal further comprises: responsive to the clock signal indicating the first phase of the plurality of phases: connecting, by a seventh switch of the plurality of switches, a first terminal of the fourth capacitor to the second input pin; connecting, by an eighth switch of the plurality of switches, a second terminal of the fourth capacitor to the third input pin; and connecting, by a ninth switch of the plurality of switches, a second terminal of the third capacitor to the third input pin; and responsive to the clock signal indicating the second phase of the plurality of phases: connecting, by a tenth switch of the plurality of switches, the first terminal of the fourth capacitor to the first input pin; connecting, by an eleventh switch of the plurality of switches, a second terminal of the fourth capacitor to the first output pin; and connecting, by a twelfth switch of the plurality of switches, a second terminal of the third capacitor to the second output pin.

Example 9

The method of any combination of examples 1-8, wherein the circuit is a first circuit, wherein the first circuit determines the second differential signal during a first phase, the method further comprising: determining, by a second circuit and during a second phase, the second differential signal, wherein the second circuit is identical to the first circuit, wherein the first phase and the second phase are non-overlapping.

Example 10

The method of any combination of examples 1-9, further comprising: determining, by an analog-to-digital converter, a digital sample of the second differential signal; or processing, by one or more analog processing components, the second differential signal.

Example 11

The method of any combination of examples 1-10, wherein a difference between the third voltage signal and the fourth voltage signal is substantially equivalent to a difference between the first voltage signal and the second voltage signal.

Example 12

A system comprising: a first input pin configured to receive a first voltage signal of a first differential voltage signal; a second input pin configured to receive a second voltage signal of the first differential voltage signal, wherein the first differential voltage signal includes a first common mode voltage; a second input pin configured to receive a second common mode voltage; a circuit comprising a plurality of capacitors and a plurality of switches, wherein the circuit is configured to determine a second differential voltage signal based on the first differential voltage signal, wherein the second differential voltage signal includes the second common mode voltage; a first output pin; and a second output pin, wherein the circuit is configured to substantially continuously output the first voltage signal of the second differential voltage signal at the first output pin, and wherein the circuit is configured to substantially continuously output the second voltage signal of the second differential signal at the second output pin.

Example 13

The system of example 12, wherein each switch of the plurality of switches is configured to switch between a plurality of states, and wherein the states of the plurality of switches are determined based on a clock signal.

Example 14

The system of any combination of examples 12-13, wherein the circuit is configured to substantially continuously output the first voltage signal of the second differential voltage signal by at least: outputting the first voltage signal of the second differential voltage signal when a switch of the plurality of switches is in any state of the plurality of states; and not outputting the first voltage signal of the second differential voltage signal when the switch is switching amongst the plurality of states, and wherein the circuit is configured to substantially continuously output the second voltage signal of the second differential voltage signal by at least: outputting the second voltage signal of the second differential voltage signal when a switch of the plurality of switches is in any state of the plurality of states; and not outputting the second voltage signal of the second differential voltage signal when the switch is switching amongst the plurality of states.

Example 15

The system of any combination of examples 12-14, further comprising: a comparator configured to compare a voltage signal of the second differential voltage signal with the second common mode voltage; logic configured to, in response to the difference between the voltage signal of the second differential voltage signal and the second common mode voltage being greater than a threshold, toggle the clock signal.

Example 16

The system of any combination of examples 12-15, wherein the clock signal indicates a plurality of non-overlapping phases, wherein a second phase of the plurality of phases is substantially shorter than a first phase of the plurality of phases, wherein a first terminal of a second capacitor of the plurality of capacitors is connected to the second input pin, wherein, in response to the clock signal indicating the first phase of the plurality of phases: a first switch of the plurality of switches is configured to connect a first terminal of a first capacitor of the plurality of capacitors to the first input pin; a second switch of the plurality of switches is configured to connect a second terminal of the first capacitor to the first output pin; and a third switch of the plurality of switches is configured to connect a second terminal of the second capacitor to the second output pin, and wherein, in response to the clock signal indicating the second phase of the plurality of phases: a fourth switch of the plurality of switches is configured to connect the first terminal of the first capacitor to the second input pin; a fifth switch of the plurality of switches is configured to connect the second terminal of the first capacitor to the third input pin; and a sixth switch of the plurality of switches is configured to connect the second terminal of the second capacitor to the third input pin.

Example 17

The system of any combination of examples 12-16, wherein a second terminal of a third capacitor of the plurality of capacitors is connected to the second terminal of the second capacitor, wherein a first terminal of a fourth capacitor of the plurality of capacitors is connected to the first input pin, wherein a second terminal of the fourth capacitor is connected to the second terminal of the first capacitor, wherein, in response to the clock signal indicating the first phase of the plurality of phases: a seventh switch of the plurality of switches is configured to connect a first terminal of the third capacitor to the second input pin; wherein, in response to the clock signal indicating the second phase of the plurality of phases: an eighth switch of the plurality of switches is configured to connect the first terminal of the third capacitor to the first input pin.

Example 18

The system of any combination of examples 12-16, wherein a first terminal of a third capacitor of the plurality of capacitors is connected to the first terminal of the second capacitor, wherein, in response to the clock signal indicating the first phase of the plurality of phases: a seventh switch of the plurality of switches is configured to connect a first terminal of a fourth capacitor of the plurality of capacitors to the second input pin; an eighth switch of the plurality of switches is configured to connect a second terminal of the fourth capacitor to the third input pin; and a ninth switch of the plurality of switches is configured to connect a second terminal of the third capacitor to the third input pin; and wherein, in response to the clock signal indicating the second phase of the plurality of phases: a tenth switch of the plurality of switches is configured to connect the first terminal of the fourth capacitor to the first input pin; an eleventh switch of the plurality of switches is configured to connect a second terminal of the fourth capacitor to the first output pin; and a twelfth switch of the plurality of switches is configured to connect a second terminal of the third capacitor to the second output pin.

Example 19

The system of any combination of examples 12-18, wherein the circuit is a first circuit, wherein the first circuit is configured to determine the second differential voltage signal during a first phase, the system further comprising: a second circuit comprising a plurality of capacitors and a plurality of switches, wherein the second circuit is configured to determine, during a second phase, the second differential voltage signal based on the first differential voltage signal, and wherein the first phase and the second phase are non-overlapping.

Example 20

The system of any combination of examples 12-19, further comprising: an analog-to-digital converter configured to determine a digital sample corresponding to the second differential voltage signal; or an analog processing circuit configured to process the second differential voltage signal.

Example 21

The system of any combination of examples 12-20, wherein a difference between the third voltage signal and the fourth voltage signal is substantially equivalent to a difference between the first voltage signal and the second voltage signal.

Example 22

An apparatus comprising: means for receiving a first differential signal including a first voltage signal and a second voltage signal, wherein the first differential signal includes a first common mode voltage; means for receiving a second common mode voltage; means for determining, by a circuit, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage; and means for outputting, substantially continuously, the second differential signal.

Various aspects have been described in this disclosure. These and other aspects are within the scope of the following claims.

The invention claimed is:
1. A method comprising:
receiving a first differential signal including a first voltage signal and a second voltage signal, wherein the first differential signal includes a first common mode voltage, wherein the first voltage signal is received at a first input pin of a plurality of input pins and the second voltage signal is received at a second input pin of the plurality of input pins;
receiving a second common mode voltage;

determining, by a circuit that comprises a plurality of switches that are each configured to switch between a plurality of states, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage; and outputting, substantially continuously, the second differential signal, wherein the third voltage signal is output at a first output pin of a plurality of output pins and the fourth voltage signal is output at a second output pin of the plurality of output pins, and wherein, during a particular state of the plurality of states, respective current paths are created between the input pins and the output pins.

2. The method of claim 1, wherein the states of the plurality of switches are determined based on a clock signal.

3. The method of claim 2, wherein outputting, substantially continuously, the second differential signal comprises:
outputting the second differential signal when a switch of the plurality of switches is in any state of the plurality of states; and
not outputting the second differential signal when the switch is switching amongst the plurality of states.

4. The method of claim 2, further comprising:
determining the clock signal by comparing the second common mode voltage to a voltage signal of the second differential signal.

5. The method of claim 4, wherein determining the clock signal by comparing the second common mode voltage with the fourth voltage signal comprises:
responsive to determining that a difference between the voltage signal of the second differential signal is greater than a threshold, toggling the clock signal.

6. The method of claim 2, wherein the circuit further comprises a first capacitor and a second capacitor, wherein the second common mode voltage is received at a common mode input pin, wherein the second input pin is connected to a first terminal of the second capacitor, wherein the clock signal indicates a plurality of non-overlapping phases, wherein a second phase of the plurality of phases is substantially shorter than a first phase of the plurality of phases, and wherein determining the second differential signal comprises:
responsive to the clock signal indicating the first phase of the plurality of phases:
connecting, by a first switch of the plurality of switches, a first terminal of the first capacitor to the first input pin;
connecting, by a second switch of the plurality of switches, a second terminal of the first capacitor to the first output pin; and
connecting, by a third switch of the plurality of switches, a second terminal of the second capacitor to the second output pin, and
responsive to the clock signal indicating the second phase of the plurality of phases:
connecting, by a fourth switch of the plurality of switches, the first terminal of the first capacitor to the second input pin;
connecting, by a fifth switch of the plurality of switches, the second terminal of the first capacitor to the common mode input pin; and
connecting, by a sixth switch of the plurality of switches, the second terminal of the second capacitor to the common mode input pin.

7. The method of claim 6, wherein the circuit further comprises a third capacitor and a fourth capacitor, wherein a second terminal of the third capacitor is connected to the second terminal of the second capacitor, wherein a first terminal of the fourth capacitor is connected to the first input pin, wherein a second terminal of the fourth capacitor is connected to the second terminal of the first capacitor, and wherein determining the second differential signal further comprises:
responsive to the clock signal indicating the first phase of the plurality of phases:
connecting, by a seventh switch of the plurality of switches, a first terminal of the third capacitor to the second input pin;
responsive to the clock signal indicating the second phase of the plurality of phases:
connecting, by an eighth switch of the plurality of switches, the first terminal of the third capacitor to the first input pin.

8. The method of claim 6, wherein the circuit further comprises a third capacitor and a fourth capacitor, wherein a first terminal of the third capacitor is connected to the first terminal of the second capacitor, and wherein determining the second differential signal further comprises:
responsive to the clock signal indicating the first phase of the plurality of phases:
connecting, by a seventh switch of the plurality of switches, a first terminal of the fourth capacitor to the second input pin;
connecting, by an eighth switch of the plurality of switches, a second terminal of the fourth capacitor to the common mode input pin; and
connecting, by a ninth switch of the plurality of switches, a second terminal of the third capacitor to the common mode input pin; and
responsive to the clock signal indicating the second phase of the plurality of phases:
connecting, by a tenth switch of the plurality of switches, the first terminal of the fourth capacitor to the first input pin;
connecting, by an eleventh switch of the plurality of switches, a second terminal of the fourth capacitor to the first output pin; and
connecting, by a twelfth switch of the plurality of switches, a second terminal of the third capacitor to the second output pin.

9. The method of claim 1, wherein the circuit is a first circuit, wherein the first circuit determines the second differential signal during a first phase, the method further comprising:
determining, by a second circuit and during a second phase, the second differential signal, wherein the second circuit is identical to the first circuit, wherein the first phase and the second phase are non-overlapping.

10. The method of claim 1, further comprising:
determining, by an analog-to-digital converter, a digital sample of the second differential signal; or
processing, by one or more analog processing components, the second differential signal.

11. The method of claim 1, wherein a difference between the third voltage signal and the fourth voltage signal is substantially equivalent to a difference between the first voltage signal and the second voltage signal.

12. A system comprising:
a plurality of input pins comprising a first input pin configured to receive a first voltage signal of a first differential signal and a second input pin configured to receive a second voltage signal of the first differential signal, wherein the first differential signal includes a first common mode voltage;

a common mode input pin configured to receive a second common mode voltage;

a circuit comprising a plurality of capacitors and a plurality of switches, wherein the circuit is configured to determine a second differential signal based on the first differential signal, wherein the second differential signal includes the second common mode voltage, and wherein each switch of the plurality of switches is configured to switch between a plurality of states;

a plurality of output pins comprising a first output pin and a second output pin, wherein the circuit is configured to substantially continuously output a first voltage signal of the second differential signal at the first output pin, wherein the circuit is configured to substantially continuously output a second voltage signal of the second differential signal at the second output pin, and wherein, during a particular state of the plurality of states, respective current paths are created between the input pins and the output pins.

13. The system of claim 12, wherein the states of the plurality of switches are determined based on a clock signal.

14. The system of claim 13, wherein the circuit is configured to substantially continuously output the first voltage signal of the second differential signal by at least:

outputting the first voltage signal of the second differential signal when a switch of the plurality of switches is in any state of the plurality of states; and not outputting the first voltage signal of the second differential signal when the switch is switching amongst the plurality of states, and wherein the circuit is configured to substantially continuously output the second voltage signal of the second differential signal by at least:

outputting the second voltage signal of the second differential signal when a switch of the plurality of switches is in any state of the plurality of states; and not outputting the second voltage signal of the second differential signal when the switch is switching amongst the plurality of states.

15. The system of claim 13, further comprising:

a comparator configured to compare a voltage signal of the second differential signal with the second common mode voltage;

logic configured to, in response to the difference between the voltage signal of the second differential signal and the second common mode voltage being greater than a threshold, toggle the clock signal.

16. The system of claim 13, wherein the clock signal indicates a plurality of non-overlapping phases, wherein a second phase of the plurality of phases is substantially shorter than a first phase of the plurality of phases, wherein a first terminal of a second capacitor of the plurality of capacitors is connected to the second input pin, wherein, in response to the clock signal indicating the first phase of the plurality of phases:

a first switch of the plurality of switches is configured to connect a first terminal of a first capacitor of the plurality of capacitors to the first input pin;

a second switch of the plurality of switches is configured to connect a second terminal of the first capacitor to the first output pin; and a third switch of the plurality of switches is configured to connect a second terminal of the second capacitor to the second output pin, and wherein, in response to the clock signal indicating the second phase of the plurality of phases:

a fourth switch of the plurality of switches is configured to connect the first terminal of the first capacitor to the second input pin;

a fifth switch of the plurality of switches is configured to connect the second terminal of the first capacitor to the common mode input pin; and a sixth switch of the plurality of switches is configured to connect the second terminal of the second capacitor to the common mode input pin.

17. The system of claim 16, wherein a second terminal of a third capacitor of the plurality of capacitors is connected to the second terminal of the second capacitor, wherein a first terminal of a fourth capacitor of the plurality of capacitors is connected to the first input pin, wherein a second terminal of the fourth capacitor is connected to the second terminal of the first capacitor, wherein, in response to the clock signal indicating the first phase of the plurality of phases:

a seventh switch of the plurality of switches is configured to connect a first terminal of the third capacitor to the second input pin;

wherein, in response to the clock signal indicating the second phase of the plurality of phases:

an eighth switch of the plurality of switches is configured to connect the first terminal of the third capacitor to the first input pin.

18. The system of claim 16, wherein a first terminal of a third capacitor of the plurality of capacitors is connected to the first terminal of the second capacitor, wherein, in response to the clock signal indicating the first phase of the plurality of phases:

a seventh switch of the plurality of switches is configured to connect a first terminal of a fourth capacitor of the plurality of capacitors to the second input pin;

an eighth switch of the plurality of switches is configured to connect a second terminal of the fourth capacitor to the common mode input pin; and a ninth switch of the plurality of switches is configured to connect a second terminal of the third capacitor to the common mode input pin; and wherein, in response to the clock signal indicating the second phase of the plurality of phases:

a tenth switch of the plurality of switches is configured to connect the first terminal of the fourth capacitor to the first input pin;

an eleventh switch of the plurality of switches is configured to connect a second terminal of the fourth capacitor to the first output pin; and a twelfth switch of the plurality of switches is configured to connect a second terminal of the third capacitor to the second output pin.

19. The system of claim 12, wherein the circuit is a first circuit, wherein the first circuit is configured to determine the second differential signal during a first phase, the system further comprising:

a second circuit comprising a plurality of capacitors and a plurality of switches, wherein the second circuit is configured to determine, during a second phase, the second differential signal based on the first differential signal, and wherein the first phase and the second phase are non-overlapping.

20. The system of claim 12, further comprising:

an analog-to-digital converter configured to determine a digital sample corresponding to the second differential signal; or an analog processing circuit configured to process the second differential signal.

21. The system of claim 12, wherein a difference between the first voltage signal of the second differential signal and the second voltage signal of the second differential signal is substantially equivalent to a difference between the first voltage signal of the first differential signal and the second voltage signal of the first differential signal.

22. An apparatus comprising:
   means for receiving a first differential signal including a first voltage signal and a second voltage signal, wherein the first differential signal includes a first common mode voltage, wherein the first voltage signal is received at a first input pin of a plurality of input pins and the second voltage signal is received at a second input pin of the plurality of input pins;
   means for receiving a second common mode voltage;
   means for determining, by a circuit that comprises a plurality of switches that are each configured to switch between a plurality of states, a second differential signal including a third voltage signal and a fourth voltage signal, wherein a difference between the third voltage signal and the fourth voltage signal is based on a difference between the first voltage signal and the second voltage signal, wherein the second differential signal includes the second common mode voltage; and
   means for outputting, substantially continuously, the second differential signal, wherein the third voltage signal is output at a first output pin of a plurality of output pins and the fourth voltage signal is output at a second output pin of the plurality of output pins, and wherein, during a particular state of the plurality of states, respective current paths are created between the input pins and the output pins.

* * * * *